United States Patent
Chong et al.

[11] Patent Number: 6,093,330
[45] Date of Patent: Jul. 25, 2000

[54] MICROFABRICATION PROCESS FOR ENCLOSED MICROSTRUCTURES

[75] Inventors: John M. Chong; Scott G. Adams; Noel C. MacDonald, all of Ihaca; Kevin A. Shaw, Ihaca, all of N.Y.

[73] Assignee: Cornell Research Foundation, Inc., Ihaca, N.Y.

[21] Appl. No.: 08/867,060

[22] Filed: Jun. 2, 1997

Related U.S. Application Data

[60] Provisional application No. 60/022,007, Jun. 21, 1996.

[51] Int. Cl.[7] .................................................. H01L 21/302
[52] U.S. Cl. ................... 216/2; 216/11; 216/41; 216/46; 216/51; 438/52
[58] Field of Search .................. 216/2, 11, 39, 216/41, 46, 51; 438/52

[56] References Cited

U.S. PATENT DOCUMENTS

| | | | |
|---|---|---|---|
| 3,867,497 | 2/1975 | Teich et al. | 264/81 |
| 4,178,197 | 12/1979 | Marinace | 148/175 |
| 4,417,946 | 11/1983 | Bohlen et al. | 216/2 |
| 4,429,321 | 1/1984 | Matsumoto | 346/140 R |
| 4,438,191 | 3/1984 | Cloutier et al. | 430/324 |
| 4,533,430 | 8/1985 | Bower | 156/643 |
| 4,566,935 | 1/1986 | Hornbeck | 216/2 |
| 4,587,534 | 5/1986 | Saito et al. | 346/140 R |
| 4,614,119 | 9/1986 | Zavracky et al. | 73/704 |
| 4,701,766 | 10/1987 | Sugitani et al. | 346/1.1 |
| 4,716,423 | 12/1987 | Chan et al. | 346/140 R |
| 4,756,884 | 7/1988 | Hillman et al. | 422/73 |
| 4,764,244 | 8/1988 | Chitty et al. | 156/630 |
| 4,786,357 | 11/1988 | Campanelli et al. | 156/633 |
| 4,824,073 | 4/1989 | Zdeblick | 251/11 |
| 4,863,560 | 9/1989 | Hawkins | 156/644 |
| 4,875,968 | 10/1989 | O'Neill et al. | 156/633 |
| 4,891,120 | 1/1990 | Sethi et al. | 204/299 R |
| 4,894,664 | 1/1990 | Tsung Pan | 346/1.1 |
| 4,906,840 | 3/1990 | Zdeblick et al. | 250/306 |
| 4,908,112 | 3/1990 | Pace | 204/299 R |
| 4,961,821 | 10/1990 | Drake et al. | 156/647 |
| 4,968,585 | 11/1990 | Albrecht et al. | 430/320 |
| 5,015,850 | 5/1991 | Zdeblick et al. | 250/306 |
| 5,090,932 | 2/1992 | Dieumegard et al. | 216/11 |
| 5,096,535 | 3/1992 | Hawkins et al. | 156/633 |
| 5,116,462 | 5/1992 | Bartha et al. | 156/643 |
| 5,126,768 | 6/1992 | Nozawa et al. | 346/140 R |
| 5,132,012 | 7/1992 | Miura et al. | 210/198.2 |
| 5,156,988 | 10/1992 | Mori et al. | 437/40 |
| 5,180,480 | 1/1993 | Manz | 204/299 R |
| 5,194,133 | 3/1993 | Clark et al. | 204/299 R |
| 5,198,390 | 3/1993 | MacDonald et al. | 437/203 |
| 5,209,818 | 5/1993 | Bol | 156/651 |
| 5,211,806 | 5/1993 | Wong et al. | 156/644 |
| 5,229,785 | 7/1993 | Leban | 346/1.1 |
| 5,287,082 | 2/1994 | Arney et al. | 338/307 |
| 5,296,114 | 3/1994 | Manz | 204/180.1 |
| 5,304,487 | 4/1994 | Wilding et al. | 435/291 |

(List continued on next page.)

OTHER PUBLICATIONS

Jingkuang Chen and Kensall D. Wise; "A Multichannel Neural Probe For Selective Chemical Delivery at the Cellular Level"; pp. 256–259, Jun. 1994.

Mark Zdeblick, Founder and Gordon Moore, Cofounder; Redwood Microsystems. New Frontier in Silicon Micromachining; Redwood Microsystems, Inc.

*Primary Examiner*—Randy Gulakowski
*Assistant Examiner*—Anita Alanko
*Attorney, Agent, or Firm*—Jones, Tullar & Cooper, P.C.

[57] ABSTRACT

A single-mask process for fabricating enclosed, micron-scale subsurface cavities in a single crystal silicon substrate includes the steps of patterning the substrate to form vias, etching the cavities through the vias, and sealing the vias. Single cavities of any configuration may be produced, but a preferred embodiment includes closely spaced cavity pairs. The cavities may be separated by a thin membrane, or may be merged to form an enlarged merged cavity having an overhanging bar to which electrical leads may be connected. A three-mask process for fabricating enclosed cavities with electrical contacts and electrical connections is also disclosed.

31 Claims, 10 Drawing Sheets

U.S. PATENT DOCUMENTS

| | | | |
|---|---|---|---|
| 5,316,979 | 5/1994 | MacDonald et al. | 437/203 |
| 5,317,533 | 5/1994 | Quate et al. | 365/151 |
| 5,393,375 | 2/1995 | MacDonald et al. | 216/2 |
| 5,399,415 | 3/1995 | Chen et al. | 428/209 |
| 5,415,727 | 5/1995 | Gal et al. | 216/2 |
| 5,426,070 | 6/1995 | Shaw et al. | 437/203 |
| 5,619,476 | 4/1997 | Haller et al. | 367/181 |
| 5,628,917 | 5/1997 | MacDonald et al. | 216/2 |
| 5,637,904 | 6/1997 | Zettler | 257/417 |
| 5,658,472 | 8/1997 | Bartha et al. | 216/2 |
| 5,662,814 | 9/1997 | Sugino | 216/2 |
| 5,681,484 | 10/1997 | Zanzucchi et al. | 216/2 |
| 5,683,546 | 11/1997 | Manaka | 216/2 |
| 5,690,841 | 11/1997 | Elderstig | 216/2 |
| 5,698,112 | 12/1997 | Naeher et al. | 216/2 |
| 5,719,073 | 2/1998 | Shaw et al. | 216/2 |
| 5,935,451 | 8/1999 | Dautartas et al. | 216/2 |
| 6,020,272 | 2/2000 | Fleming | 216/2 |

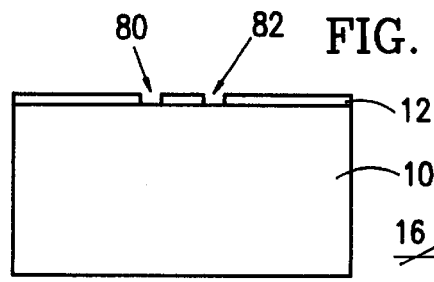
FIG. 10
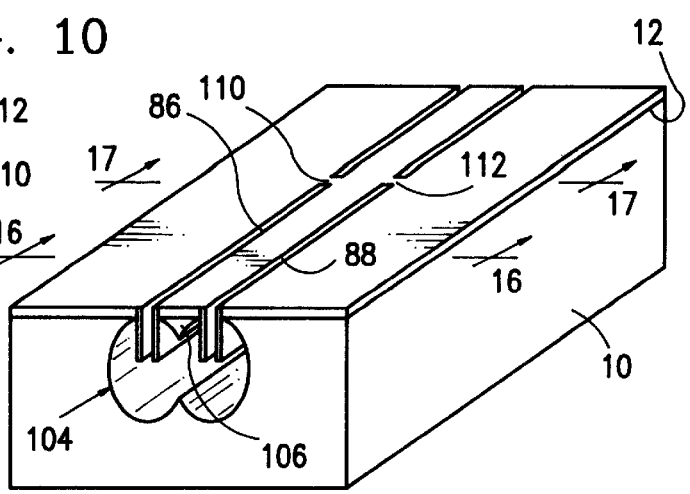
FIG. 15
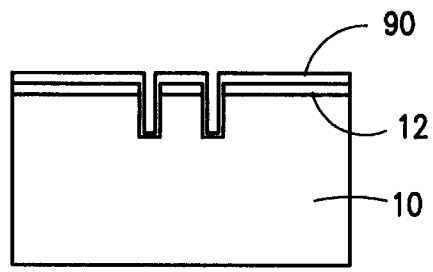
FIG. 11
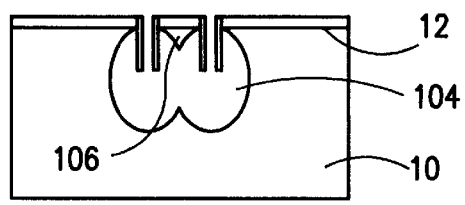
FIG. 12
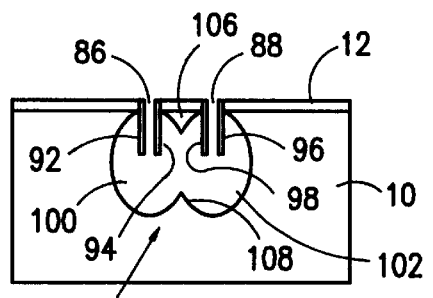
FIG. 13
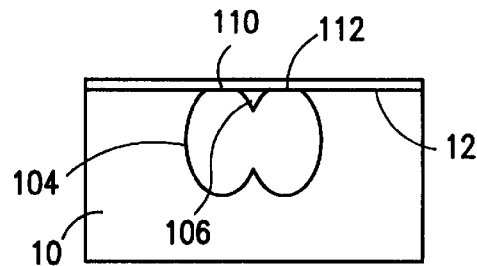
FIG. 16
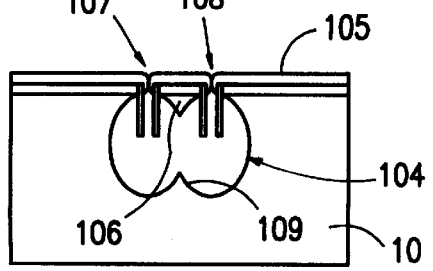
FIG. 14
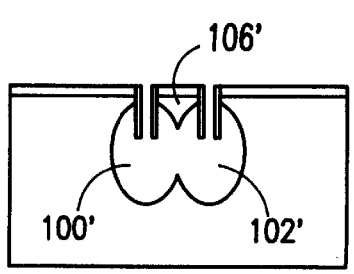
FIG. 17
FIG. 18

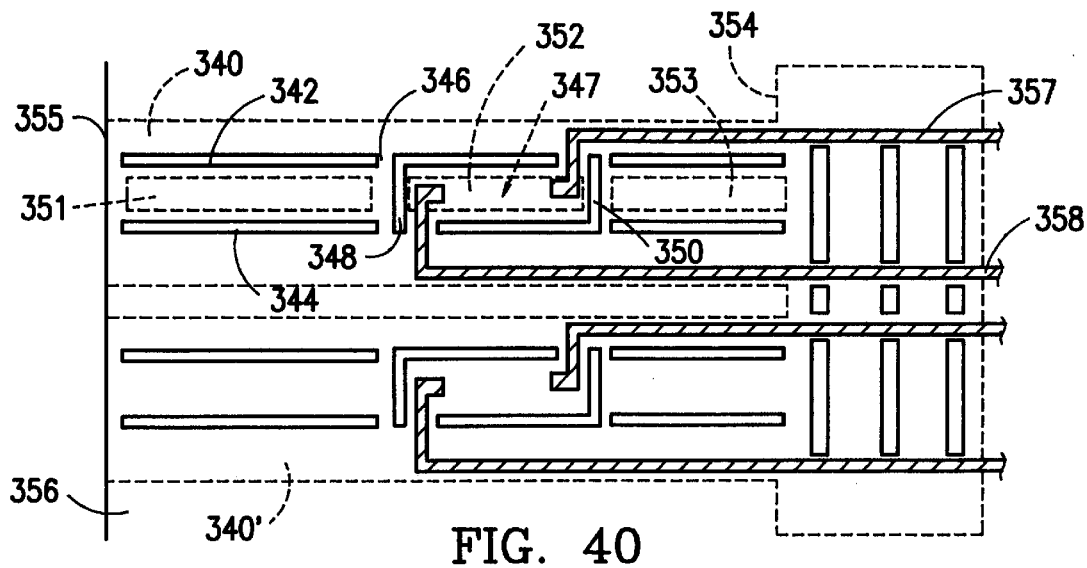
FIG. 40
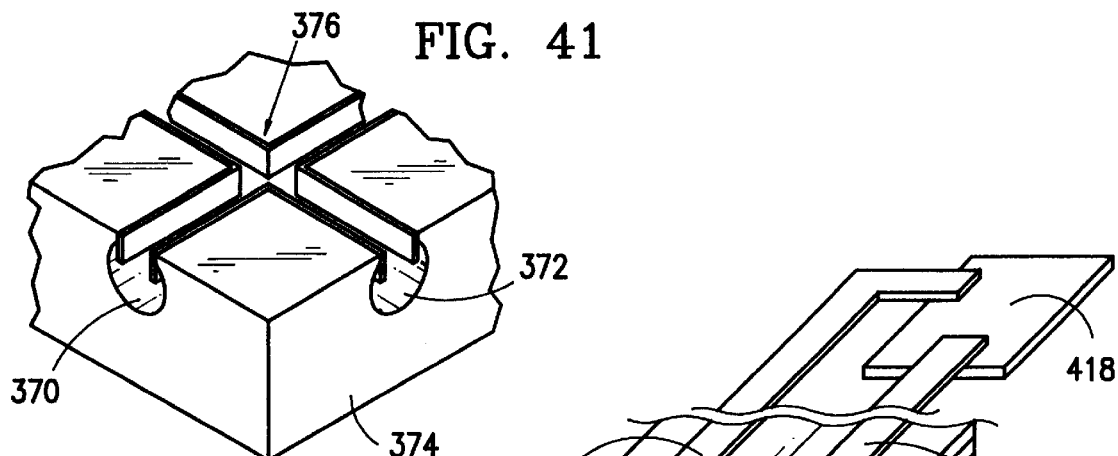
FIG. 41
FIG. 43
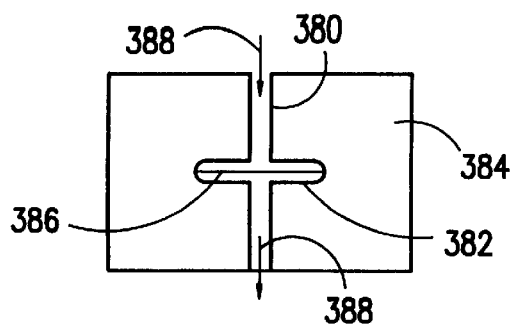
FIG. 42

MICROFABRICATION PROCESS FOR ENCLOSED MICROSTRUCTURES

This application claims the benefit of U.S. Provisional Applicaton Ser. No. 60/022,007, filed Jun. 21, 1996, the disclosure of which is incorporated herein by reference.

The invention was made with Government support under Grant No. DABT 63-95-C-0121 awarded by DARPA. The Government has certain rights in the invention.

BACKGROUND OF THE INVENTION

This invention relates, in general, to a microfabrication process for making enclosed structures, and more particularly to a process for fabricating tunnels, cavities, and similar subsurface structures within a substrate such as a single crystal silicon wafer, to the tunnels, cavities and related enclosed microstructures so fabricated, and to microfabricated devices incorporating such enclosed structures.

Recent developments in micromechanics have successfully lead to the fabrication of microactuators utilizing processes which have involved either bulk or surface micromachining. The most popular surface micromachining process has used polysilicon as the structural layer in which the mechanical structures are formed. In a typical polysilicon process, a sacrificial layer is deposited on a silicon substrate prior to the deposition of the polysilicon layer. The mechanical structures are defined in the polysilicon, and then the sacrificial layer is etched partially or completely down to the silicon substrate to free the structures.

Moving rotors, gears, accelerometers and other structures have been fashioned through the use of the foregoing process to permit relative motion between the structures and the substrate. This process relies on chemical vapor deposition (CVD) to form the alternating layers of oxide and polysilicon and provides significant freedom in device design; however, CVD silicon is usually limited to layers no thicker than 1–2 micrometers.

An alternative process has been the use of bulk micromachining wherein a silicon substrate is etched and sculpted to leave a structure. This has typically been done using wet chemical etchants such as EDP. However, such processes are dependent on the crystal orientation within the silicon substrate so it is difficult to control them. As a result, wet etch processes are not applicable to small (in the range of 1 micron or less) structure definition.

To overcome the disadvantages of the foregoing processes, a reactive ion etching (RIE) process for the fabrication of submicron, single crystal silicon, movable mechanical structures was developed, and is described in U.S. Pat. No. 5,198,390, assigned to the assignee of the present application. That process utilizes multiple masks to define structural elements and metal contacts and permits definition of small, complex structures in single crystal silicon. However, the process required a second lithography step which was difficult to apply to deeper structures because of problems in aligning the second mask. However, the use of single-crystal materials for mechanical structures is beneficial, since these materials have fewer defects, no grain boundaries, and can be scaled to submicron dimensions while retaining their structural and mechanical properties.

A single-mask, low temperature (less than about 300°), self-aligned process for fabricating micron-scale microelectromechanical (MEM) structures was developed from the process described in U.S. Pat. No. 5,198,390, and is described in copending U.S. application Ser. No. 08/312, 797, filed Sep. 27, 1994, now U.S. Pat. No. 5,719,073 which is a continuation of U.S. Ser. No. 08/013,319, filed Feb. 4, 1993, (now abandoned), the disclosure of which is hereby incorporated herein by reference. This process, known as "SCREAM I" is a dry bulk micromachining process which uses reactive ion etching to both define and release structures of arbitrary shape and to provide defined metal surfaces on the released structures, as well as on stationary interconnects, pads, and the like. The process permits fabrication of complex shapes, including triangular and rectangular structures, as well as curved structures such as circles, ellipses and parabolas for use in the fabrication of fixed and variable inductors, transformers, capacitors, switches and the like. The structures are released from the underlying substrate in the fabrication process, and can be moved with respect to the substrate.

In accordance with Ser. No. 08/312,797, a single dielectric mask is used to define deep isolating trenches which completely surround defined structures, undercutting the structures to selectively release them and to produce cavities at the bases of surrounding mesas. The released structures are then metallized, with the undercutting and cavity formation breaking the continuity of the deposited metal to thereby electrically isolate the metal on released structures and defined mesas from the metal on the substrate. The low temperature process of the foregoing application allows the process to be carried out on wafers which carry preexisting integrated circuits, and in addition permits the etching of deep, narrow trenches and subsequent deep etching beneath the side walls of the trenches to release defined structures and to produce extended cavities in the side walls surrounding the released structures.

The basic single mask process described in Ser. No. 08/312,797 can be outlined as follows:

First, a dielectric layer of oxide or nitride is deposited on a wafer or substrate, this layer serving as the single mask throughout the remainder of the steps. A standard PECVD process is used because of its high deposition rate and low deposition temperature. Thereafter, resist is spun, exposed and developed on the mask layer. Standard photolithographic resist techniques are used to define the desired beams, pads, interconnects and like structures. Thereafter, the pattern produced in the resist is transferred from the resist to the mask dielectric using, for example, $CHF_3$ magnetron ion etching (MIE) or RIE.

An $O_2$ plasma etch may be used to strip the resist layer, and the patterned dielectric mask is then used to transfer the pattern into the underlying wafer to form trenches around the desired structures. A deep vertical reactive ion etch (RIE) or chemically assisted ion beam etch (CAIBE) is required for this purpose. Depending on the choice of structure height, the trenches may be from 4 to over 20 $\mu$m deep, with substantially vertical, smooth walls.

After completion of the trenches, a protective conformal layer of PECVD oxide or nitride is applied to cover the silicon beams and other structures to a thickness of about 0.3 $\mu$m thick. The conformal dielectric layer covers the top surfaces of the surrounding substrate (or mesa), the defined structures, and the sides and the floor of the trench, so it is necessary to remove the dielectric from the trench floor, as by an anisotropic $CF_4/O_2$ RIE at 10 mT. This etch does not require a mask, but removes 0.3 $\mu$m of dielectric from the beam and mesa top surfaces and from the trench bottom, leaving the side wall coating undisturbed. As a result, the beam is left with a top surface layer and a side wall layer of dielectric, with the bottom of the trench being film-free.

A deep RIE or CAIBE is then used to etch the trench floor down below the lower edge of the sidewall dielectric. This etch preferably exposes 3 to 5 μm of substrate underneath the dielectric on each side of the beams and under the dielectric on the walls of the surrounding mesa, and it is this exposed substrate under the beams and on the mesa walls which is to be removed during the release step. The release is carried out by an isotropic RIE which etches the substrate out from under the beams or other structures, thus releasing them, and etching the substrate on the mesa walls to form cavities. The etch has high selectivity to the dielectric, allowing several microns of substrate to be etched without appreciably affecting the protective dielectric coating. After release, the beams are held cantilevered over the floor of the deep silicon trench by their connections to the surrounding mesa at their ends, for example.

Each released, cantilevered structure has a core of semiconductor material such as single crystal silicon and a conformal coating of dielectric surrounding it on the top surface and side walls. The structural beams may be cantilevered at both ends and free-floating in the center, or may be cantilevered at one end, with the other end being free-floating, for example. The structure can be activated, as by measuring its motion or by driving it into motion, by applying a voltage to a metal layer. Accordingly, as a final step, an aluminum layer is sputter deposited onto beam top surfaces and side walls, onto the floor of the trenches, and onto the top surface and side walls of the surrounding mesa. The structure is now complete and simply needs to be connected to suitable circuitry to activate it. The circuitry may be on a separate substrate or may be formed in the wafer adjacent the location of the beam prior to fabrication of the beam. It may also be desirable, depending on the application, to add a thin passivation oxide layer 100 to 200 nm thick to prevent shorting between moving structures.

Although the foregoing single mask process has numerous advantages and permits fabrication of a wide variety of microelectromechanical structures or the surfaces of substrates, it has recently been recognized that micron-scale structures located beneath the surface of a substrate would have a wide range of applications. For example, such structures could include micron-scale cavities or tunnels for carrying fluids such as gases or liquids under carefully controlled conditions for use in electrophoresis, ink jet nozzles, and the like. Microfabrication processes for use in producing extremely small and precise mechanical and eletro-mechanical structures have been used in the past to produce enclosed tunnel-like structures in a substrate, but typically such devices have been fabricated through a process of micromachining flow channels on fluid handling regions on the surface of a wafer or other substrate, and then mechanically enclosing the channels by positioning a transparent glass cover over them. However, such devices are difficult to manufacture, since they require precision mechanical alignment of very small components. This is time consuming and expensive, and thus is not entirely satisfactory.

SUMMARY OF THE INVENTION

Briefly, the present invention is directed to a process for fabricating enclosed micron-scale structures i.e., microstructures having minimum dimensions on the order of 10 microns or less. Such enclosed structures may take the form of tunnels or other subsurface enclosed cavities, and may be used in a wide variety of applications. The process of the invention is simple, is compatible with existing integrated circuit processes and structures so that it can be carried out on chips or wafers containing integrated circuits, and is highly controllable to permit the fabrication of enclosed structures in a wide range and variety of configurations.

Thus, microstructures can be fabricated which have a wide range of configurations and uses in fluid flow applications such as mass spectrometers, biological and chemical synthesizers and analyzers, gas sensors, ink dispensers for printers, pressure sensors, display devices, optical applications, and the like. The subsurface structures may be embedded in a substrate, may be suspended, as by way of released beams, may have a wide range of cross sectional sizes and shapes, may be linear or curved, may have minimum dimensions in the submicron range, may be as long as desired, and in general may incorporate a wide range of features which permit their use in a variety of applications.

In accordance with a preferred form of the present invention, subsurface structures are fabricated in single crystal silicon utilizing the SCREAM process described in copending Ser. No. 08/312,797. Thus, for example, a mask oxide is deposited on a substrate such as a single crystal silicon wafer. A resist layer is deposited on the oxide and is lithographically patterned to define the shapes and locations of trenches, or via channels, which in turn define the location and shape of the subsurface structures to be fabricated. The via pattern is transferred into the oxide mask, the resist material is stripped away, and an anisotropic silicon etch is used to produce vertical via channels in the top portion of the substrate following the via pattern. Thereafter, a sidewall oxide is deposited on the walls of the via channels, the oxide which reaches the floors of the channels is removed, and an isotropic silicon etch is used to produce a subsurface cavity beneath and along each via channels. This process is generally similar to the SCREAM process described in Ser. No. 08/312,797, with the subsurface cavities conforming to the location of corresponding via channels, and the diameter, or cross sectional size, of each cavity being determined by the duration of the etch. Thereafter, an oxide layer is deposited on the top surface of the substrate, with this top layer filling in and covering the via channels to seal the entrances to their respective subsurface cavities and to thereby form enclosed subsurface structures having shapes and dimensions determined by the via channels and the etch duration. A single structure may be formed in this manner, or, if desired, multiple structures having any desired spacing, configuration, or location can be provided all as defined by the via channel location, spacing and shape. The structures can intersect each other, can be spaced apart by walls or membranes, or adjacent structures can merge together to form single, enlarged structures. The diameters of the subsurface structures can be varied from one to the next, or the diameter of a single structure can be varied along its length, all controlled by the lithographic pattern and by the parameters of the etching process. If desired, one or more electrically and/or thermally isolated beams containing one or more cavities, tunnels, or enclosed spaces may be provided; furthermore, the beams may be suspended for relative motion with respect to the surrounding substrate and can be made transparent to various wavelengths.

In its broadest aspect, the present invention relates to a process for fabricating a single subsurface cavity in the form of a tunnel formed at the bottom of a via channel and to the tunnel structure so formed. The tunnel is an enlarged cavity at the base of the channel and extending laterally on both sides of the channel, with the cavity being aligned with the via channel so that it extends contiguously along the length of the channel. The shape and dimensions of the via channel are determined during a masking step prior to formation of the channel, while the dimensions of the cavity at the base of the channel are determined primarily by the geometry of the via channel and by the duration of an etching step which forms the cavity. The tunnel is closed at least partially by depositing material such as silicon dioxide, nitride, or other dielectric material on the surface of the substrate material in which the tunnel is fabricated, or by growing a sealing layer on that surface. The degree to which the tunnel is sealed by the surface material is determined in part by the width of the via channel, and in part by the amount of material deposited or grown on the surface. Accordingly, by careful design of the via channel width and control of the sealing process step, the closure of the tunnel is easily controlled.

In a preferred form of the invention, the via channel is fabricated by an RIE etch through a patterned surface mask. Thereafter, the sidewalls of the via channel are covered by a dielectric material and anisotropic etching step is used to etch the cavity, or tunnel, at the base of the via channel. The depth of the tunnel below the surface of the substrate, and thus below the mask layer, is thus controllable by the depth of the via channel in the substrate and by the length of time for the etching step. Alternatively, the pattern in the pattern mask can be used directly as the via channel, with a tunnel being etched in the substrate material immediately below the mask layer so that the tunnel is near the surface of the substrate and is covered by the mask layer.

The tunnel can have different dimensions along its length, can incorporate enlarged cavities at selected locations and can have any desired shape, as determined by the pattern formed in the pattern mask layer and determined by the type and duration of the etching of the substrate through the pattern. The tunnel can be located completely within the substrate material or can be located in exposed beam portions released from the substrate to provide access to the tunnel for applying electrical or magnetic fields to the material for various purposes, such as controlling it, sensing it, heating it, or the like, or for providing optical access to the interior of the tunnel. Thus, the substrate material adjacent the tunnel location can be etched to remove the material adjacent the location of the tunnel, or completely surrounding that location, to leave a thin wall of substrate material or to leave a wall formed from a dielectric coating previously formed inside the tunnel. This thin wall can be supported by the substrate along one side, or can be released to be free from the substrate completely around the circumference of the tunnel. If desired, selected parts of the wall portion of the tunnel can be oxidized for optical transparency, electrical isolation, enhancement of the interior surface characteristics, etc.

If desired, during the fabrication of the tunnel, but before the via channel is closed, the interior of the tunnel cavity can be coated with a dielectric layer, a metal layer, or other material to provide desired characteristics. Similarly, after the tunnel is exposed or released, as described above, the outer surface can be coated with a dielectric layer, a metal layer, or both.

It will be understood that any number of tunnels can be formed in the substrate, the tunnels having various shapes and being located to provide fluid flow paths in desired locations within the substrate. The tunnels can be parallel to each other, can intersect each other, can connect cavities within the substrate to other cavities or to external structures located, for example, at the edge of a wafer, as may be required to carry out various desired functions of the tunnels. In another aspect of the invention, two or more parallel tunnels can be etched for a sufficiently long duration to cause the tunnels to be separated only by very thin membranes, on the order of less than one micron, or even to completely etch away the separating walls between adjacent tunnels to produce a single, enlarged subsurface cavity. Such cavities may be defined by patterning the pattern mask on the substrate to produce closely-spaced parallel via channels. The parallel via channels are separated by an island formed in the substrate, with the tunnel etching process extending under the island from both of the adjacent via channels to release the island and to thereby produce a single crystal silicon bar extending above the resulting subsurface cavity. It will be understood that more than two parallel via channels can be provided in this manner, in which case multiple silicon bars are provided above the resulting subsurface cavity. The channels can have different dimensions by isotropically etching them for different lengths of time.

The bars may be held in place above the cavity by means of lateral bridges extending perpendicular to the length of the bar from the bar to the surrounding substrate. One or more bridges may be provided along the length of each bar to support it along the length of the via channel and thus along the length of the is subsurface cavity. The selection of the number of via channels and the spacing between adjacent via channels as well as the duration of the RIE etch forming the via channels and the isotropic etch forming the subsurface cavities at the bases of the channels determines the size of the resultant cavities and their distance below the surface of the substrate. The duration of the etch also determines whether the tunnels beneath each via channel remains separated by thin wall sections, or membranes so that the tunnels remain separate and parallel, or whether the parallel tunnel large subsurface cavity. When multiple parallel trenches are spaced far enough apart so that etching of the tunnel at the base of each channel undercuts the island but does not etch away all of the silicon, a silicon bar, or beam, remains over the resulting cavity. This overhanging bar is silicon, in the preferred form of the invention. The supporting bridges described above are sufficiently narrow that the anisotropic etching process removes all of the silicon, leaving only the oxide mask layer supporting the overhanging bar so that the bar is electrically isolated from adjacent bars and from the surrounding substrate. Multiple bars and corresponding bridges can be spaced along the length of the tunnel, or multiple side-by-side bars can be provided for a single, large subsurface cavity.

The electrically isolated overhanging bars can be connected to bonding pads on the substrate for electrical connection to external circuits. Alternatively, they can be connected to electrical contacts on the surrounding substrate by way of vias opened in the oxide masking layer on the top surface of the bar and on the top surface of the substrate, followed by a metallization step which connects a surface layer of metal to the bar and to the substrate through these vias. These bars can serve as contacts for supplying potentials to such fluids, can be used as heaters, or like uses. If desired, passive devices such as resistors or active electrical devices such as pn junctions, diodes, transistors, field effect transistors, and the like can be fabricated on, or on top of the tunnels, for use, for example, as electrical sensors for monitoring fluids in the cavity.

Multiple tunnels or cavities separated by membranes or wide cavities can be located in exposed or released beams, in the manner described above with respect to single tunnels. Multiple spaced released segments can be provided, and the released segments can be electrically isolated. This can be done, for example, by oxidizing the interior of a tunnel and then removing the conductive silicon surrounding the tunnel at specific locations along the length of the tunnel. Thereafter, the remaining portion is released with silicon. Alternatively, isolation can be obtained by oxidizing selected portions of the beam and by similarly isolating corresponding overhanging bar segments so that high potentials can be placed across a subsurface cavity, along the length of a cavity, or between spaced cavities.

The above-described tunnels and cavities, which may be generally referred to hereinafter as subsurface structures, may have almost limitless dimensional variations, depending on the function which the structure is to perform. The preferred SCREAM process enables such structures to have minimum dimensions in the submicron range, and maximum dimensions of any practical size, often in the range of many millimeters. For example, a single subsurface tunnel may have a diameter of a few microns and a length of several millimeters, while a subsurface cavity, made up of multiple merged tunnels may have lateral and longitudinal dimensions in the range of several millimeters with the depth of several microns. The structures can vary in size along their length, and since the structures are not dependent on the crystal and structure of the substrate in the single crystal silicon embodiment, can take on any desired shape or configuration.

The structures can incorporate electrical contacts for supplying electric fields across fluids in the tunnels or cavities. Such contacts may also be used to heat the fluids, while circuit components, such as capacitive plates and transistors for sensing or driving fluid within the tunnels or structures can be provided. Mechanical structures such as fixed or movable membranes can be fabricated, as well as transparent windows, suspended movable beams, and the like. Electromechanical structures such as capacitor plates on flexible tunnel walls or membranes can be provided to enable controlled motion of the tunnel walls or of membranes for mechanical pumping of fluids, for example, while capacitor plates on exterior walls of released beams can be provided for producing or sensing motion of the beams. Numerous other applications of the subsurface microstructures of the invention for uses in ink jet printing, electrophoresis, mechanical pumps, electric field and magnetic field pumps, and the like will become evident from the following detailed description of the invention.

The herein-described process for fabricating subsurface microstructures is much simpler than prior tunnel structures utilizing micromachining process, since the need for mechanical alignment of micron-dimensioned parts is eliminated. The process is extremely flexible, allowing control of the length and width of tunnels and cavities, control of the profile of the tunnels including regulation of the depth of the tunnels below the surface of the substrate are usually accomplished by controlling the process steps. The subsurface microstructures are independent of the crystal orientation of the wafer so that rounded profiles can be provided within fluid flow tunnels, for example, to provide improved flow characteristics. The process is compatible with SCREAM and SCREAM-related processes for fabricating a variety of released structures in a substrate, and is compatible with preexisting integrated circuits on wafers to enable control and sensing circuits to be directly connected to the subsurface structures, such connects being facilitated by the ability of the process to form isolated overhanging silicon bars on the tunnels and cavities. Such bars can be used as electrodes, field emission tips, resistors, transistors, or the like, all fabricated with the associated circuitry on a single wafer.

The ability to release the subsurface structures permits thermal and electrical isolation of the structures, allows controlled movement or vibration of the structures and allows optical access to the interior of the structures. The micromachining process of the invention permits not only extremely small dimensions, but allows the structures to be scaled upwardly in dimension, with tunnels 25 microns or more in diameter being fabricated in accordance with the invention. The process permits a high density of tunnels with as small as one micron separation, and allows selective merging of adjacent tunnels or separation of the tunnels by thin walls to permit temperature, pressure and flow sensing and to provide heat interchange between adjacent flow channels, and the like. Thus, numerous advantages flow from the fabrication process and from the subsurface microstructures of the invention.

BRIEF DESCRIPTION OF THE DRAWINGS

The foregoing, and additional objects, features and advantages of the present invention will be apparent to those of skill in the art from a consideration of the following detailed description of preferred embodiments thereof, taken in conjunction with the accompanying drawings, in which:

FIGS. 10–14 illustrate the use of the process of FIGS. 1–5 with multiple via channels to produce an enlarged subsurface cavity structure;

FIG. 15 illustrates the structure of FIG. 13 in a perspective view;

FIG. 16 is a cross-sectional view taken along line 16—16 of FIG. 15;

FIG. 17 is a cross-sectional view taken along line 17—17 of FIG. 15;

FIG. 18 and 19 illustrate variations in the process of FIGS. 10–14 to control the dimensions of the subsurface structure;

FIG. 40 is a top plan view of a modified form of the device of FIG. 37;

FIG. 41 is a diagrammatic perspective view of a subsurface microstructure incorporating intersecting tunnels;

FIG. 42 is a diagrammatic top plan view of a pair of intersecting tunnels, one of which incorporates a membrane;

FIG. 43 is a diagrammatic perspective view of a solenoid fabricated in accordance with the invention;

DESCRIPTION OF PREFERRED EMBODIMENTS

Turning now to a more detailed consideration of the present invention, FIGS. 1–5 illustrate basic process steps for fabricating enclosed subsurface microstructures, or tunnels, in accordance with the present invention. A wafer, or substrate 10, preferably of single crystal silicon, is covered with a thin mask layer 12 of oxide which preferably is deposited on the upper surface 14 of the wafer.

Figure 1:
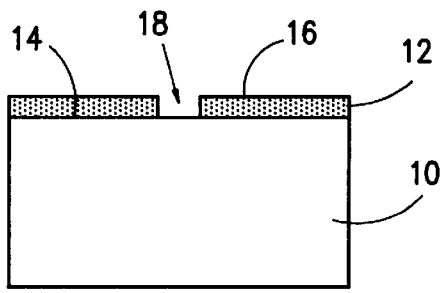
FIGS. 1–5 illustrate a preferred process for fabricating a single enclosed subsurface microstructure tunnel in accordance with the present invention.

In conventional manner, a resist layer (not shown) is spun onto the top surface 16 of the mask layer and is patterned lithographically, again in conventional manner, to produce in the resist layer a pattern which defines the location of a subsurface microstructure such as a tunnel or tunnels to be formed in the substrate. This resist pattern is transferred to the mask layer 12 in conventional manner to form one or more pattern vias in the mask layer, such as via 18 illustrated in FIG. 1, and the resist layer is stripped. The patterned oxide layer 12 then serves as a pattern mask for forming corresponding subsurface microstructures. Although FIG. 1 illustrates only a single via in the pattern mask, it will be understood that any desired number of vias may be provided, in any desired pattern, with each via being shaped to produce desired microstructures to be described.

A vertical silicon etch using, for example, $Cl_2$ and indicated by arrow 22, is applied to the upper surface 14 of wafer 10 through the via 18 in mask layer 12 to etch a corresponding via channel such as channel 24, in the substrate, to thereby transfer the mask pattern to the substrate. The via channel is etched to the depth where the center of a tunnel is to be formed; for example, the channel may be about 5 μm deep for a tunnel that is to be about 10 μm in diameter, although greater or lesser depths may be utilized, depending upon the desired tunnel configuration. The via channel has substantially vertical sidewalls 28 and a substantially horizontal bottom wall, or floor 30.

Upon completion of the via channel 24, a thin conformal protective oxide layer 32 is deposited, as by chemical vapor deposition (CVD), on the top surface 16 of oxide layer 12. This layer extends into the via channel 24 to coat the channel sidewalls and floor. The oxide layer 32 on all horizontal surfaces, including the floor of the channel, is then etched away, leaving the sidewalls 28 of the via channel covered by a sidewall oxide layer 34 (see FIG. 4). The exposed floor of the channel is the single crystal silicon substrate 10.

Figure 4:
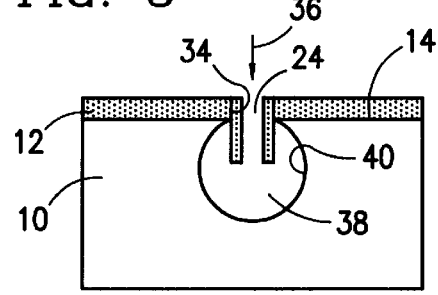

As illustrated in FIG. 4, an isotropic silicon etch of $SF_6$, indicated by arrows 36, is utilized to form in the substrate at the base of the via channel a subsurface microstructure in the form of a tunnel 38. The isotropic etch extends in all directions into the substrate material from the bottom of the via channel 24 until the channel 38 is of a desired diameter. The depth of the via channel 24 and the duration of the etch are controlled to cause the tunnel 38, which is approximately centered on the bottom of the via channel, to have its circumference 40 approximately tangent with the top surface 14 of the substrate. In many cases it may be desirable to form a single subsurface tunnel 38 from to a single mask via 18 and its corresponding via channel 24; however, it is often desirable to position two or more via channels sufficiently close together that the etching process causes two adjacent tunnels to merge into a single enlarged cavity, as will be described below.

Upon completion of the etching of tunnel 38 to its desired diameter and shape, a sealing layer 50 is deposited on top of the wafer structure, and thus on the top surface of oxide layer 12. This sealing layer, which may be silicon dioxide or other dielectric material, not only covers the layer 12, but extends over, and partially into, the via channel 24 to close the channel and thereby seal this access to tunnel 38 along a seal line 51. The sealing layer encloses the subsurface microstructure, which may be referred to herein as a subsurface enclosed tunnel.

Figure 5:
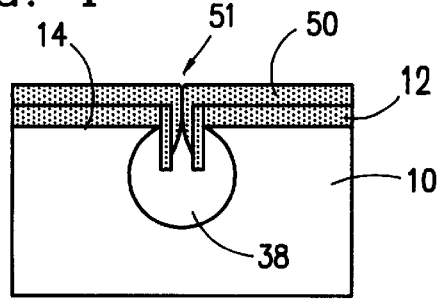
Figure 6:
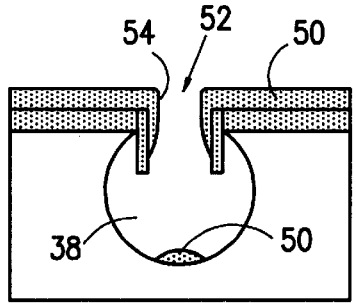
FIG. 6 illustrates the effect of a wide via channel in the device of FIGS. 1–5.

In fabricating the enclosed tunnel 38, the via 18 and the via channel 24 are patterned to be narrow enough so that the sealing layer 50 will fill the via and the via channel and close them off in the manner illustrated in FIG. 5. If the vias are too wide, as illustrated at via 52 in FIG. 6, the sealing material will fall through the via and via channel into the tunnel 38, leaving an opening 54 into the tunnel. This may be a desirable feature in some microstructures; thus, the width of the via is selectable to provide either an open or an enclosed tunnel.

Figure 7:
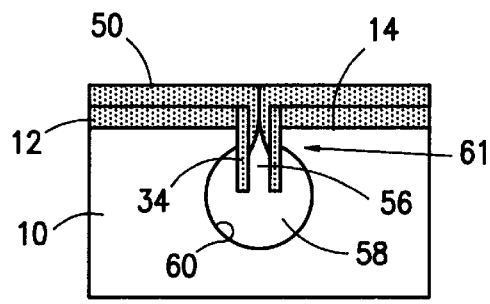
FIG. 7 illustrates the effect of deeper via channels in the device of FIGS. 1–5.

As indicated above, the location of the enclosed subsurface tunnel can be controlled by the depth of the via channel in the substrate. This is illustrated in FIG. 7, wherein a via channel 56 is extended more deeply into the substrate 10 than was channel 24. This causes the dielectric sidewall layer 34 to extend more deeply into the substrate so that when the isotropic etch is carried out, the resulting tunnel 58 is formed more deeply below the surface 14 of the substrate. As illustrated, the circumference 60 of tunnel 58 does not contact the surface 14, but remains below that surface by a selected distance 61 dependent upon the depth of via 56 and the duration of the isotropic etch. This provides an additional control for the location of the enclosed subsurface microstructure.

Figure 2:
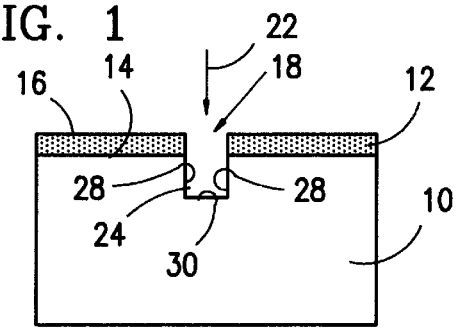
Figure 3:
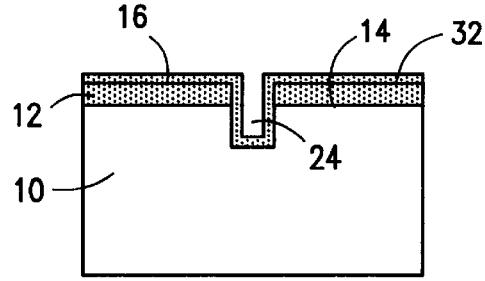
Figure 8:
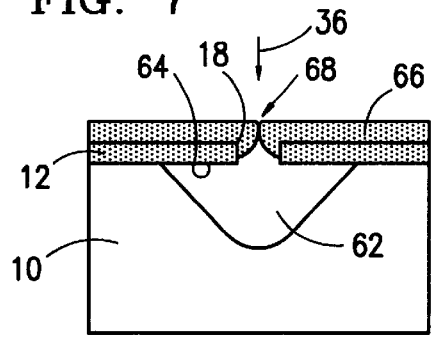
FIG. 8 illustrates the use of a pattern via for direct isotropic etching of the substrate.

If desired, the step of forming the via channel 24, illustrated in FIGS. 2 and 3, may be omitted, and the isotropic etch step of FIG. 4 can be carried out utilizing the mask via 18, as illustrated in FIG. 8. In this case, the isotropic etch 36 produces a cavity, or subsurface tunnel 62 which has its center at the via 18, and thus is generally semicircular in cross-section, as viewed in FIG. 8, with the bottom surface 64 of mask layer 12 forming the top half of the tunnel. The via 18 may be closed by a dielectric layer 66 deposited on the top surface of mask layer 12, in the manner described with respect to FIG. 5 to enclose the microstructure 62 along a seal line 68.

Figure 9:
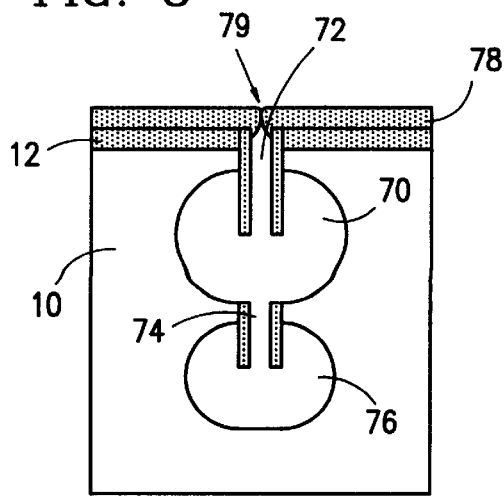
FIG. 9 illustrates a stacked tunnel microstructure.

Another alternative form of the subsurface microstructure is illustrated in FIG. 9, wherein a first subsurface tunnel 70 is formed at the base of a via channel 72 in substrate 10, in the manner described with respect to FIGS. 1–4. Thereafter, a second vertical etch may be performed utilizing via channel 72 as a mask to produce a second via channel 74 in vertical alignment with via 72 at the bottom of tunnel 70. Thereafter, a further isotropic etch step produces a second tunnel 76 at the base of via channel 74, thereby producing stacked, parallel and vertically aligned tunnels 70 and 76. These tunnels may then be sealed by a dielectric layer 78 along a seal line 79, in the manner described with respect to FIG. 5.

FIGS. 10–14 illustrate the process of FIGS. 1–5 in the fabrication of an enlarged subsurface cavity produced by the merging of two parallel tunnels. This is accomplished by providing in the pattern mask 12 on substrate 10 at least two pattern mask vias 80 and 82. These vias were spaced apart by about eight micrometers in one example, and can take any desired shape, as described above. The vertical silicon etch indicated by arrows 84 produces two parallel via channels 86 and 88 in the substrate 10, after which a thin conformal protective oxide layer 90 is provided on the top surface of mask layer 12 and on the sidewalls and floor of the via channels 86 and 88, as illustrated in FIG. 12 and as described with respect to FIG. 3. Thereafter, as illustrated in FIG. 13, the oxide layer 90 is removed from the horizontal surfaces, leaving sidewall oxide layers 92 and 94 in via channel 86 and sidewall oxide layers 96 and 98 in via channel 88. Thereafter, an isotropic silicon etch of the substrate through via channels 86 and 88 produces corresponding tunnels 100 and 102 which merge to form a single cavity generally indicated at 104. Thereafter, as illustrated in FIG. 14, a sealing, or closure layer 105 may be deposited on the top surface of the mask layer 12 to close the via channels 86 and 88, leaving a large, enclosed cavity 104 in the substrate 10.

As illustrated in FIG. 13, the etching process for forming tunnels 100 and 102 is preferably stopped after the adjoining tunnels have merged so as to leave a small region 106 of silicon attached to the under surface of the mask layer 12 between the channel vias. For elongated tunnels or cavities, this region 106 will be generally triangular in cross-section to form an overhanging bar or ridge of single crystal silicon. If desired, this overhanging region can be made in the form of a generally conical tip instead of a bar by making the length of the region between the via channels approximately equal to that width of the region, prior to the isotropic etching step of FIG. 13. The bar (or tip) 106 is located over the center of the merged cavity 104 and is physically separated from the substrate 10 along its side edges by the pattern vias 80 and 82 and by the via channels 86 and 88. The silicon bar 106 can also be separated from the substrate 10 at its ends, as by reducing the spacing between channels 86 and 88 or by providing a transversely-extending via channel. This will ensure that the bar is etched completely away in selected locations, so as to electrically and thermally isolate the remaining bar from the substrate. This isolated bar may be used for a variety of purposes, as will be described below.

It will be noted that the sealing of the via channels produces surface sealing lines 107 and 108, and that the etching process for producing tunnels 100 and 102 also leaves a ridge 109 at the bottom of cavity 104, which ridge is essentially a mirror image of bar 106. If desired, this ridge 109 may be removed by an angled anisotropic etch through the via channels 86 and 88 in order to provide an improved shape for the interior surface of the tunnel. Similarly, the sidewall oxide layers 92, 94, 96 and 98 can also be removed, if desired, with a suitable etchant. Alternatively, the merged channels can be fabricated without leaving a mirror ridge 109 by use of an etch which progressively undercuts further and further laterally as it etches vertically into the substrate.

FIG. 15 is a perspective view of the device of FIG. 13, before the sealing layer 105 is applied. As illustrated, the via channels 86 and 88 extend longitudinally to define the length and configuration of the cavity 104. Although the channels 86 and 88 and the resulting cavity 104 are illustrated as being linear, it will be understood that they may be curved or otherwise configured, as may be required for the end use to which the cavity is to be put, as will be further explained hereinbelow.

In order to support the bar 106 above the cavity 104, the mask layer 12 may be patterned to provide dielectric bridges, such as those illustrated in FIG. 15 at 110 and 112, extending between the bar 106 and the adjacent substrate 10. Such bridges may be formed at various locations along the length of the channel 104 to provide the necessary support for the isolated bar 106. The open via channels of FIG. 15 are illustrated in the cross-section of FIG. 16, taken at 16—16 of FIG. 15, while the bridges are illustrated in the cross sectional view of FIG. 17, taken along line 17—17 of FIG. 15.

Figure 19:
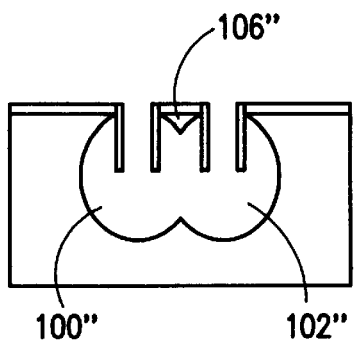

As illustrated in FIGS. 18 and 19, the size and shape of the overhanging bar 106 (FIG. 13–17) can be varied by controlling the duration of the etch and the spacing between the parallel via channels. Thus, in FIG. 18 a shorter duration etch results in an overhanging bar 106' which is larger than that illustrated in FIG. 13–17 and at the same time results in tunnels 100' and 102' which are smaller than those of FIG. 13–17. Similarly, by spacing the via channels apart as illustrated in FIG. 19, and/or increasing the duration of the isotropic etch, the tunnels are enlarged, as illustrated at 100" and 102", while at the same time the overhanging beam is reduced in size, as illustrated at 106". Extending the duration of the isotropic etch even further can completely eliminate the overhanging beam, and this may be done to provide electrical isolation between adjacent segments of the bar.

Figure 20:
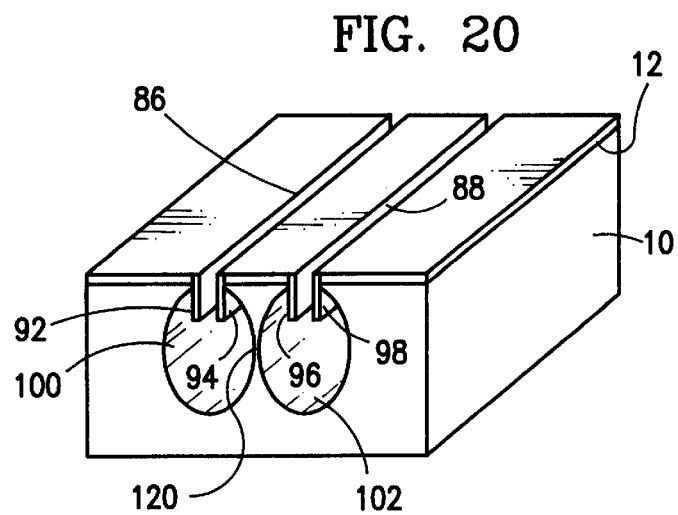
FIG. 20 is a perspective view of a structure incorporating a membrane and fabricated in accordance with the process of FIGS. 10–14.

FIG. 20 illustrates a variation of the process illustrated in FIGS. 10–14, wherein the step of etching the tunnels 100 and 102 by an isotropic silicon etch is terminated before the two tunnels merge. This results in a thin wall or membrane 120 being left between the channels so that when the oxide sealing layer 106 is placed on top of pattern mask layer 12, in the manner illustrated in FIG. 14, two parallel subsurface microstructures separated by a thin wall will be provided. This wall has numerous uses, which will be described hereinbelow. The layer sealing 105 is not illustrated in FIG. 20 for simplicity, and in order to more clearly illustrate the via channels 86 and 88 and the associated tunnels 100 and 102.

It should be noted that, if desired, the side wall oxide layers 92, 94, 96, 98 may be removed with an isotropic oxide etch prior to the application of the oxide sealing layer 105.

Figure 21:
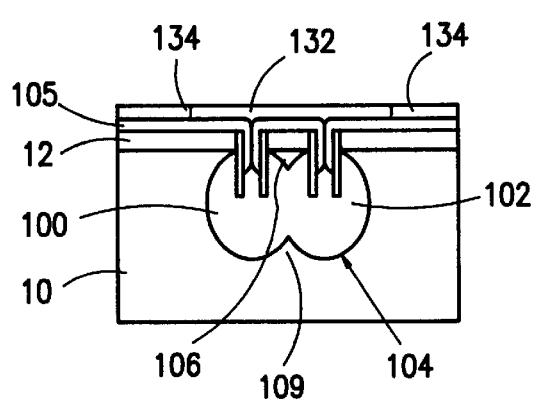
FIGS. 21–23 illustrate a modification of the process of FIGS. 10–14, including the steps of releasing a beam containing an enclosed microstructure tunnel, with FIG. 23 being drawn without a sealing layer for clarity.
Figure 22:
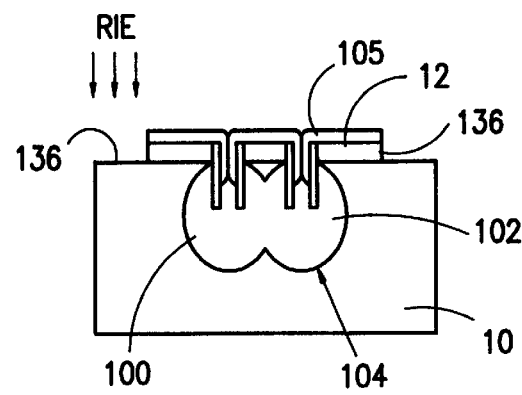
Figure 23:
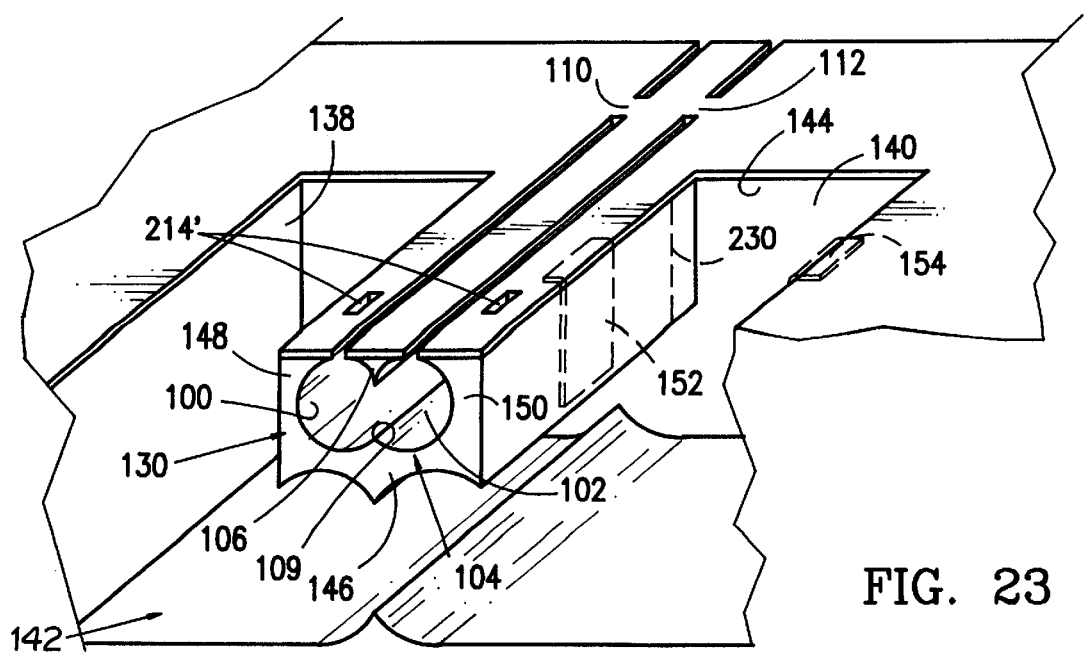

FIGS. 21, 22, and 23 illustrate a modification of the process described above with respect to FIGS. 10–14, wherein the subsurface structure 104 can be incorporated in an exposed or released beam 130 (FIG. 23). In this modification, a resist layer 132 is spun onto the top surface of oxide sealing layer 105 (FIG. 21) and the resist is patterned at 134 in conventional manner to define the desired shape and location of the beam 130. As illustrated, the beam encompasses at least a part of cavity 104, which extends through the substrate 10 into the beam. The beam pattern 134 in the resist layer is transferred to the oxide layers 12 and 105 as illustrated at 136 in FIG. 22, and thereafter the single crystal silicon substrate 10 is etched in accordance with the procedures outlined, for example, in U.S. Pat. No. 5,316,979, to form vertical trenches 138 and 140 and undercut cavity 142 to mechanically release beam 130 and tunnel 104 from substrate 10, as illustrated in FIG. 23. This figure illustrates the released beam without the sealing oxide layer 105 for clarity in illustrating the overhanging bar 106, the ridge 109, and the bridges 110 and 112 which support the bar 106.

The beam 130 is illustrated as being cantilevered from a side wall 144 of cavity 142 in the substrate; however, it could be fabricated to bridge across the cavity 142 if desired. Alternatively, the beam can be formed by trenches 138 and 140 alone, without the undercutting step, so that the beam remains supported by the substrate along its bottom 146, but has its side walls 148 and 150 exposed. Although the beam 130 is illustrated as incorporating cavity 104, it will be understood that the beam can incorporate a pair of tunnels 100 and 102 formed in the manner illustrated in FIG. 20, with a separating membrane therebetween, that multiple spaced-apart tunnels may be provided, that the cavity can be formed by multiple side-by-side tunnels, and that other subsurface microstructures can be incorporated in the beam.

When the tunnel is released, as illustrated, for example, in FIG. 23, the exterior side wall surfaces of the resulting beam can be metalized to place a capacitive plate 152 on an exterior sidewall of the beam and a matching plate 154 on an adjacent wall of the surrounding substrate for connection to external circuitry. These two plates can then be used as capacitive sensors to detect motion of the beam due, for example, to fluid flow or changes in fluid parameters within the tunnel, or can be energized by a suitable potential difference to cause vibration of the beam for further processing of fluids within the tunnel. The fabrication of such external capacitive plates is described in U.S. Pat. No. 5,198,390.

Figure 24:
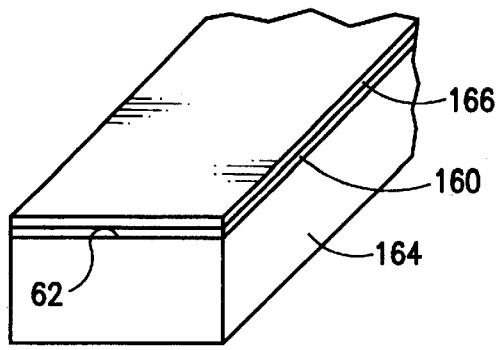
FIGS. 24–33 illustrate a three-mask process for fabricating a subsurface microstructure with an overhanging bar and for providing metal interconnects between the bar and circuitry on an adjacent substrate.
Figure 27:
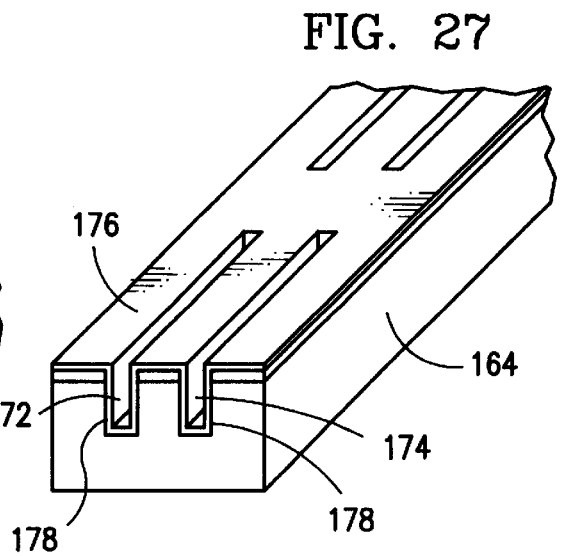
Figure 25:
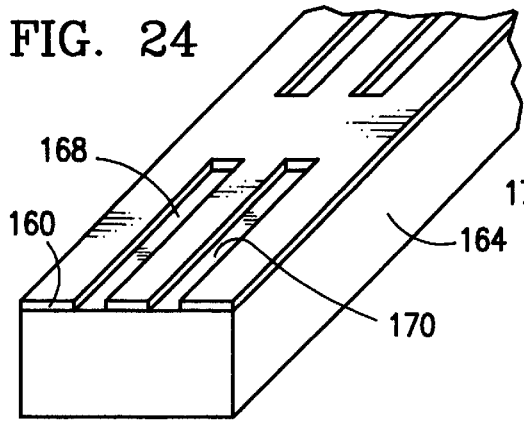

The overhanging bar 106 illustrated in the above-described embodiments can be used as an electrical resistive heater, as an electrode to apply electric fields to fluids within the cavity 104, can be used as a sensor, or can be used for a variety of other uses. In many cases, the overhanging bar needs to be connected to external electrical circuitry to permit such operations, and FIGS. 24–33 illustrate a three-mask process for fabricating the subsurface microstructures, the overhanging silicon bar, and low-resistance electrical contacts for the bar. In accordance with this aspect of the invention, the bar is fabricated by initially following the process of FIGS. 10–14. Thus, as illustrated in FIG. 24, a pattern mask oxide layer 160 is deposited on the top surface 162 of a substrate 164 such as a single crystal silicon wafer. A resist layer 166 is placed on the top surface of mask layer 160 and is lithographically patterned in a convention manner in accordance with the desired location of the channel vias which are to be formed, and this pattern is transferred to the mask oxide layer 160 to provide via patterns 168 and 170 (FIG. 25).

Figure 26:
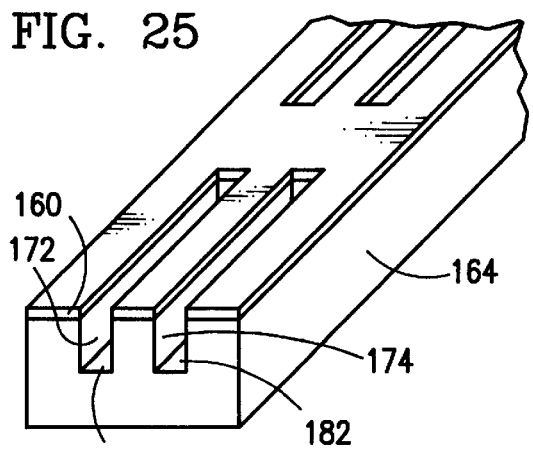
Figure 28:
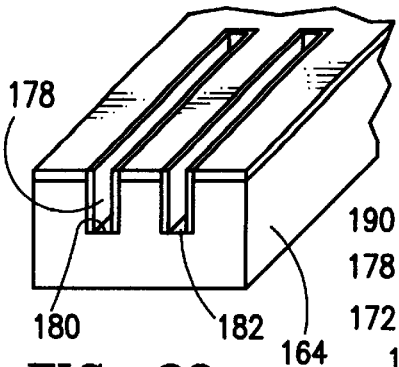

Thereafter, a vertical silicon etch is performed through the mask via pattern 168, 170 to produce channel vias 172 and 174 in the substrate 164, as illustrated in FIG. 26. As illustrated in FIG. 16, a conformal oxide layer 176 is then deposited on the top surface on the substrate and its mask layer 160, with the conformal layer extending down into the channel vias 172 and 174 to form side wall oxide layers 178 in the via channels. The deposition of layer 176 forms an oxide layer on the floors 180, 182 of channel vias 172 and 174, respectively, and this floor oxide is removed, together with that part of surface layer 176 which is on horizontal surfaces on the substrate, as illustrated in FIG. 28, leaving the wall oxide layers 178 and exposing the substrate material 164 at the channel via floors 180 and 182.

Figure 29:
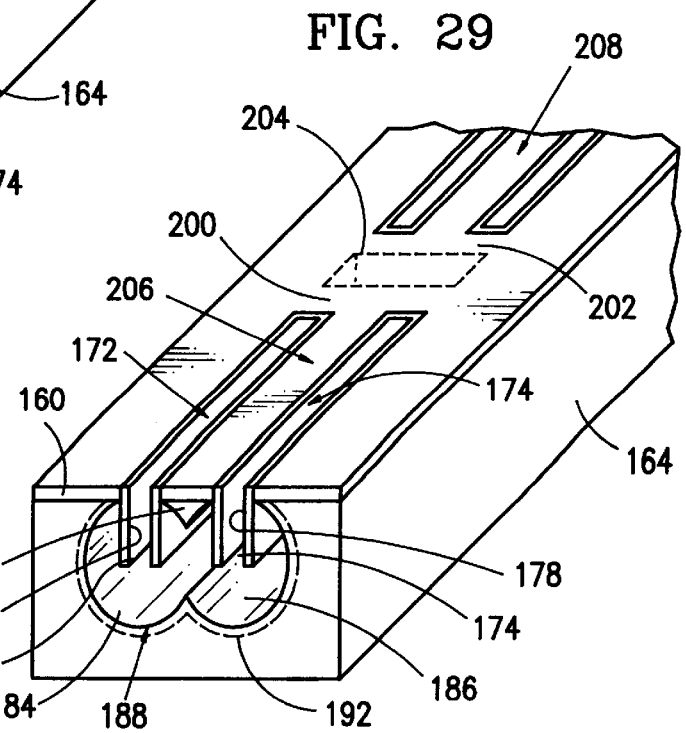

An isotropic silicon etch is then performed, as described above with respect to FIG. 13, and as illustrated in FIG. 29, through the channel vias 172 and 174 to form corresponding subsurface tunnels 184 and 186. As illustrated in FIG. 29, the duration of the etching step is sufficient to merge the tunnels 184 and 186 to produce a single subsurface cavity 188 and to produce a central, overhanging bar 190 formed of the same material as the substrate 164; in this case, single crystal silicon. As described above with respect to FIG. 20, by shortening the etch process, a membrane, or wall might be left between the two tunnels 184 and 186, if desired. Also, if desired, the side wall oxide layers 178 may be removed by etching.

Figure 30:
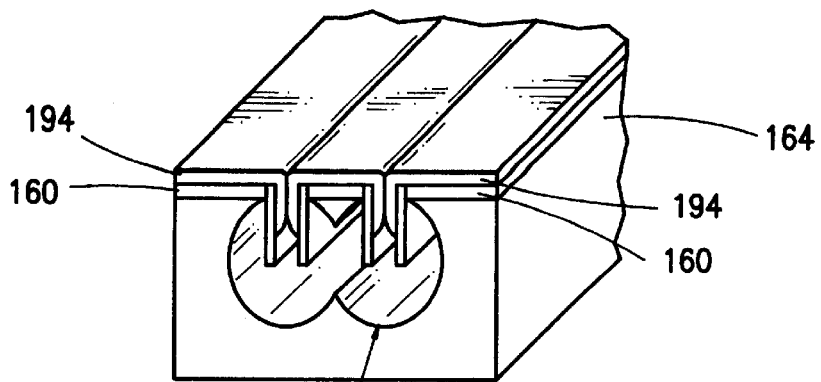

For some applications of the subsurface structure 188, it may be desirable to insulate a fluid or other material in the channel from the substrate material 164. In such an event, the channel can be thermally oxidized to produce a layer of oxide on the surface of the cavity, as indicated by the dotted line at 192 in FIG. 29. Thereafter, a sealing layer 194 of oxide may be placed on top of the mask oxide layer 160, as illustrated in FIG. 30, to close off the entrances to cavity 188 through via channels 172 and 174, as described above with respect to FIG. 14.

As illustrated, for example, in FIG. 29, the overhanging bar 190 is connected to the substrate 164 at spaced intervals by means of bridges 200 and 202. These bridges are defined in the initial lithography, and are formed from the oxide pattern layer 160. The bar 190 may extend continuously under the region where bridges 200 and 202 join, or may be segmented by locating a laterally extending via channel, or trench across the width of the bar, as indicated by the dotted lines at 204. By providing a lateral channel, the isotropic silicon etch will remove silicon from under the region of bridges 200 and 202 to electrically and mechanically isolate segments of the overhanging bar along the length of the cavity 188. By completely etching the silicon material under the bridge regions 200 and 202, either from the via channels 172 and 174 or from these via channel in combination with laterally extending via channels such as channel 204, the overhanging bar 190 is divided into electrically and mechanically isolated segments 206 and 208 which are separated from the adjacent substrate 164. The bar segments are mechanically supported by the electrically insulating bridges 200 and 202 formed in the oxide layer 160. In this way, multiple isolated bars of silicon can be positioned along the length of the cavity, with the length of each bar segment being selected in accordance with the functions which it is to perform.

Figure 31:
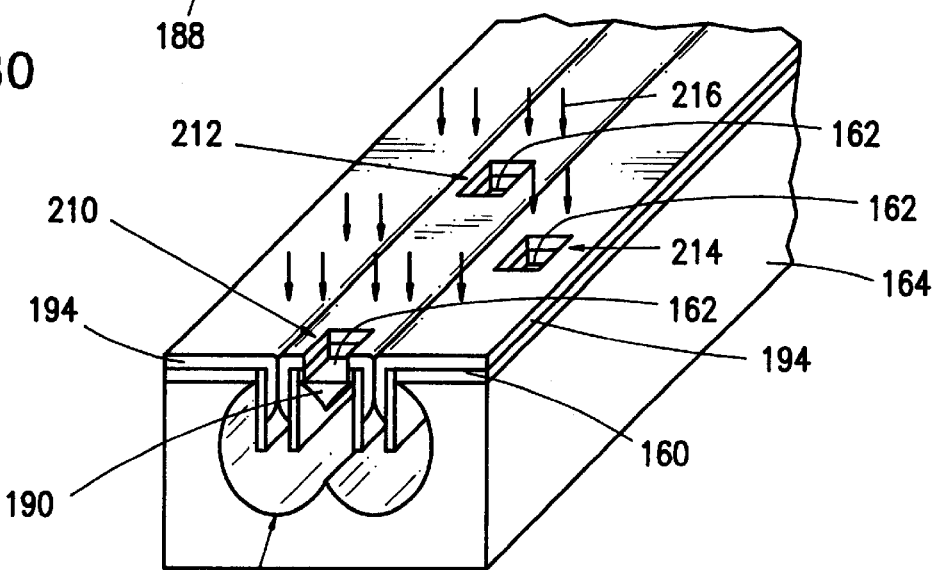

Electrical contact may be made with the overhanging bar or bar segments through vias formed in the overlying oxide layer, as illustrated in FIG. 31. To fabricate such vias, a resist layer is first placed over the sealing oxide layer 194 and is patterned, using conventional methods to define the desired location or locations of electrical contacts. The pattern may define contacts with the beam 190, with the adjacent substrate, or with both. The resist pattern is then transferred to the oxide layers 194 and 160, as illustrated by the patterns 210, 212 and 214 in FIG. 31, by a vertical etch to expose the top surface 162 of the substrate 164. In the region of the overhanging beam 190, the surface 162 of the substrate is also the top surface of the overhanging beam. Thereafter, the surface 162 is ion implanted, as indicated by arrows 216, through the pattern vias 210, 212 and 214 to provide corresponding low resistance contact regions, such as the region 220 illustrated in FIG. 32 on overhanging bar 190. Similar implant regions are produced in the contact vias 212 and 214.

Figure 32:
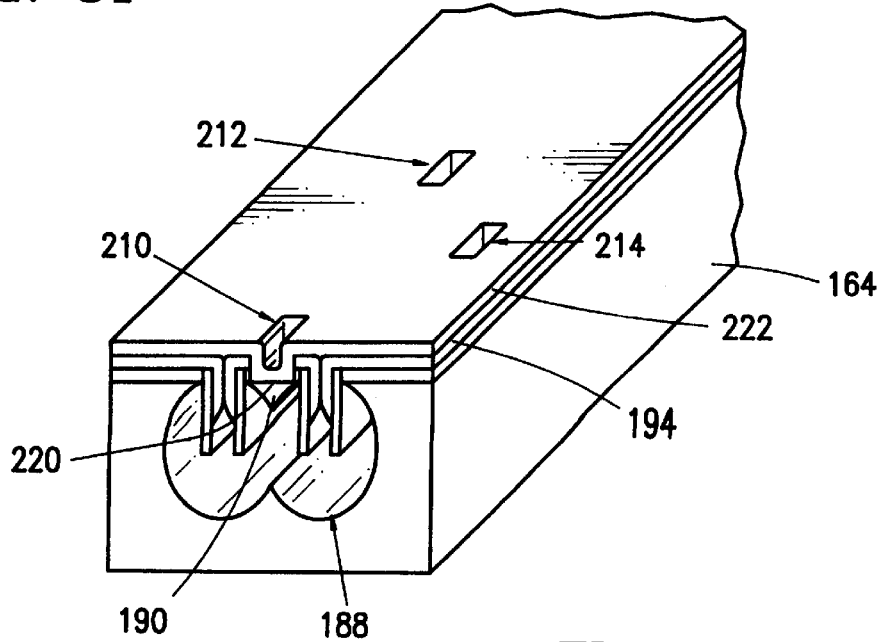

The resist layer is then removed, and a metal layer 222 is deposited on top of the sealing oxide layer 194. The metal is deposited in the contact vias 210, 212 and 214 where it is deposited on the implant region 220 in the bottom of each contact via, as illustrated in FIG. 32. The metal layer is then patterned in a conventional manner using a suitable resist mask layer to produce metal interconnect regions 224 indicated in FIG. 33. Although two interconnect regions and three contacts are shown, it will be understood that as many connections as desired can be made to the segments of the isolated bar 190, to the substrate, and to circuit components located in the substrate. In addition, contacts can be made with the silicon surrounding the channel, as may be particularly desirable in cases where the channel is released and the silicon surrounding the channel is isolated from the substrate.

Figure 33:
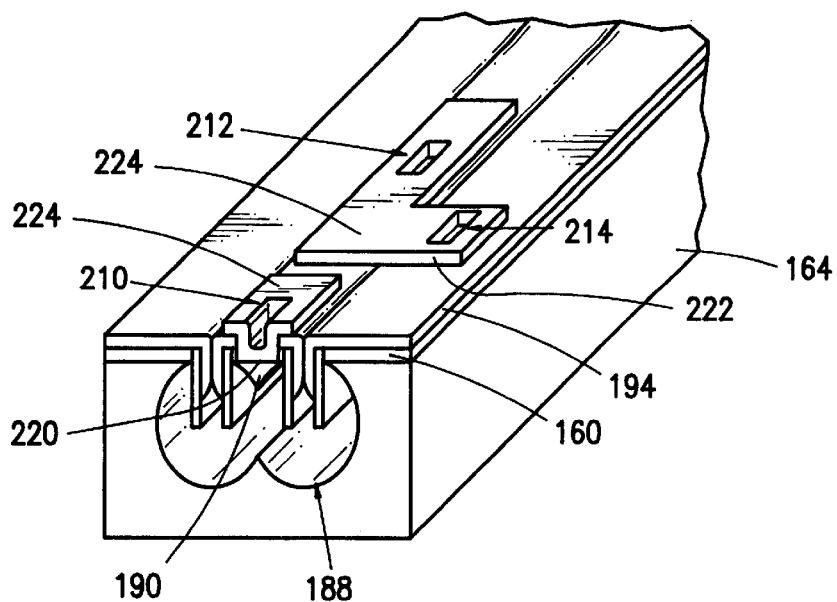

Bar 190 may be a passive resistive device in the embodiment illustrated in FIG. 33, enabling it to serve as a resistive heating unit for use in heating fluids carried in the corresponding cavity or for use in establishing a temperature gradient along the length of the cavity. The bar can also be used as a sensing element for detecting various characteristics or parameters of fluids carried in the cavity 188; for example, such an element can be used to measure heat loss and to thereby determine fluid flow. Additionally, the bar 190 can be doped through a masking via to form a pn junction, a transistor, or other active electrical device which can then be used as a sensor. The fabrication of a transistor on a released beam of single crystal silicon is illustrated, for example, in U.S. Pat. No. 5,397,904, assigned to the assignee of the present application, the disclosure of which is hereby incorporated herein by reference. The active devices can be connected to external circuitry carried on the wafer by way of the electrical connectors 224 illustrated in FIG. 33 so that the subsurface microstructure and the circuitry for use in conjunction with that structure are all integrated on a single wafer.

The overhanging silicon bar can also be connected to an electrical source and utilized as a field emitter for use as an electron accelerator, a plasma igniter, or an electrode for establishing an electric field gradient across the fluid in the tunnel. The bar may also be used as an electrode for use in an electrochemical cell or, with appropriate doping, can be used as a photodiode for giving off or sensing light, allowing the bar 190 to be used as an illuminator or as a catalyst for photochemical reactions within the cavity 188.

As described in the above-noted U.S. Pat. No. 5,397,904, selected regions of the bar 190 may be oxidized to produce electrically isolated segments along the length of a single bar, instead of using the lateral via channel 204 described with respect to FIG. 29 to divide the bar mechanically. These isolated segments may be connected to external circuitry by way of contacts 210, 212, and connectors 214, for example, to permit the establishment of electric fields in selected locations within the tunnel, which fields may then be used, for example, to control the motion of ions within the tunnel by suitable switching of the voltages applied to adjacent segments.

As described with respect to FIG. 23, when tunnels or cavities are included in a beam 130, the beam provides sidewalls 148 and 150 and a bottom wall 146 surrounding the tunnel. The sidewalls and bottom wall may be connected to a suitable source of electrical current, as by contact vias, such as the via 214 described above, located on the tops of walls 148 and 150 at 214' to provide a current path around the circumference of cavity 104 to permit the walls of the tunnel to act as a heating element. Electrical connections to the beam sidewalls and bottom wall also permit the application of high electric fields along the length of the tunnel, or across the tunnel, when used in conjunction, for example, with an electrical connection to the bar 106 by way of a contact via 210 on the bar. The beam 130 may be isolated electrically from the surrounding substrate by oxidizing the beam, as at 230.

Figure 34:
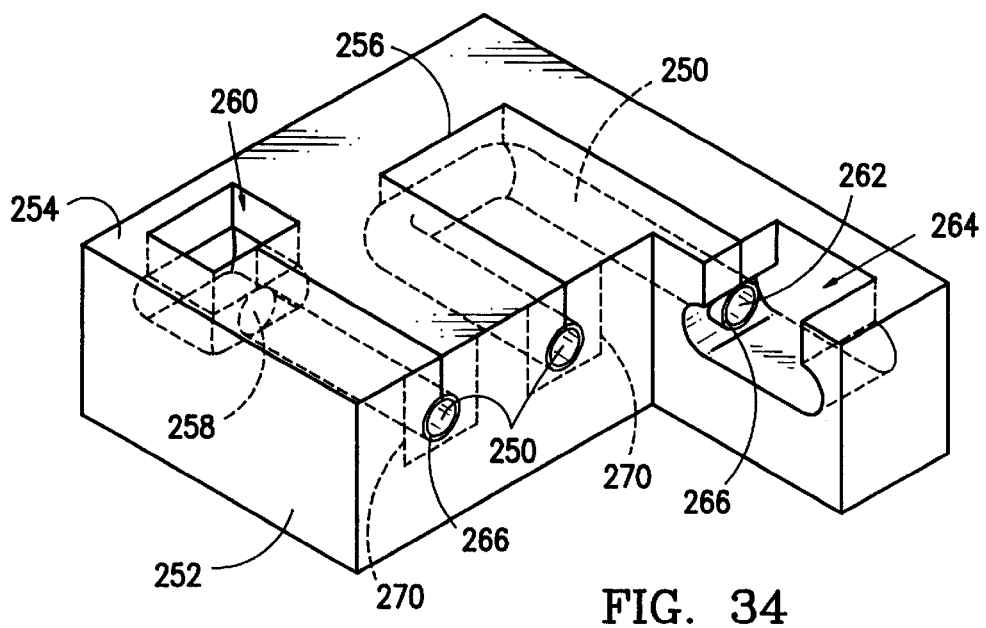
FIGS. 34 is a perspective view of a tunnel fabricated in accordance with the present invention and adapted for use in electrophoresis.

As has been described, the tunnels and cavities fabricated in accordance with the present invention may be generally linear, as illustrated in FIGS. 15, 23 or 29, but depending on the use to which the cavities are to be put, they can take a wide range of shapes and sizes. Thus, for example, FIG. 34 illustrates a sinuous tunnel 250 fabricated in a single crystal silicon substrate 252 which may incorporate one or more integrated circuits (not shown), as previously noted. The tunnel 250 is formed by the processes described above, with the sealing line 256 produced by closing the via channel on the top surface 254 indicating the location of the via channel leading to the tunnel. As illustrated in this figure, the tunnel 250 may be connected at a first end 258 to an inlet port 260 fabricated in the substrate 252. This inlet port may be produced by the reactive ion etching processes described above for producing the tunnels. Instead of a narrow via (used to define the channels) which is eventually sealed, an area large enough not to be sealed is defined and etched for the port 260. Similarly, the output end 262 of the subsurface tunnel 250 may terminate in an exit port 264 formed in the same manner as inlet port 260. In such a device, the tunnel typically may be 10 micrometers in diameter and can be of any desired length.

The process for making the device of FIG. 34, in brief, includes depositing a mask oxide, which in one example was 2–5 micrometers in thickness, on a single crystal silicon substrate, and patterning and etching the mask oxide. Thereafter, a deep silicon etch, which can be about 10–50 micrometers in depth, was used to form the via channel and a conformal oxide layer was deposited on the top surface of the substrate and on the via walls. This oxide layer was 0.5 to 1.0 micrometers in thickness and was deposited by a CVD process, in the example. Thereafter, the horizontal surfaces of the conformal oxide layer were etched back to clear the channel bottom. If desired, a second deep silicon etch of 10–30 micrometers could be performed to deepen the via channel, but this is optional. Thereafter, an isotropic silicon etch was used to form the channel 250 and to form the input and exit ports. A sealing oxide was then deposited over the top surface of the substrate to close the channel vias at the sealing line 256. Although a single tunnel is illustrated, it will be understood that multiple tunnels may be provided. The multiple tunnels may be arbitrarily located in the substrate, or may be parallel and separated by a membrane. Alternatively, two or more tunnels may be merged to provide a cavity with one or more overhanging bars.

As previously noted, before sealing the vias, a dielectric layer, such as a thermal oxide, may be provided on the inner surfaces of the tunnel, as indicated by layer 266 in FIG. 34. This additional layer provides a protective surface on the interior wall of the channel, for example to provide resistance to chemicals carried in the tunnel or for electrical or thermal isolation of fluids in the tunnel from the substrate.

Figure 35:
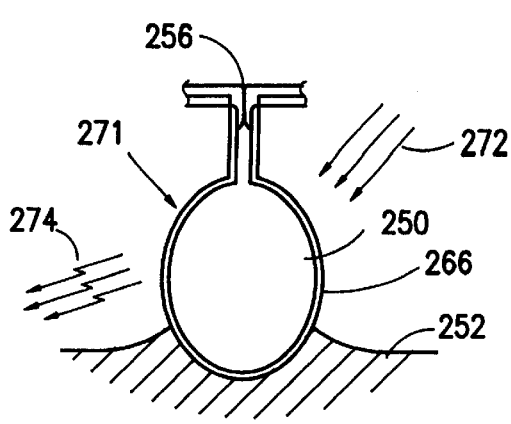
FIG. 35 is a diagrammatic illustration of a partially released tunnel.

A further option for the device of FIG. 34 is to release part of the tunnel 250 so that it is located in a cantilevered beam such as the beam 130 in FIG. 23. The beam may be located in one or more of the areas illustrated by dotted outlines 270 in FIG. 34, for example. Alternatively, as illustrated in FIG. 35, after the tunnel is oxidized thermally to provide oxide layer 266, selected portions of the tunnel may be partially released from the substrate 254, as by a silicon etch which removes a selected portion of the surrounding substrate material by etching away the top surface of the substrate, leaving an upper portion 271 of the tunnel exposed. The exposed portion of the tunnel is composed of the oxide 266, which is optically transparent. This enables a light source such as a laser 272 to be directed into the tunnel to illuminate fluid in the tunnel through the oxide layer 266. If, for example, the fluid is capable of fluorescence in response to impinging laser light, such fluorescence, indicated at 274, may be detected by a suitable sensor (not shown).

Figure 36:
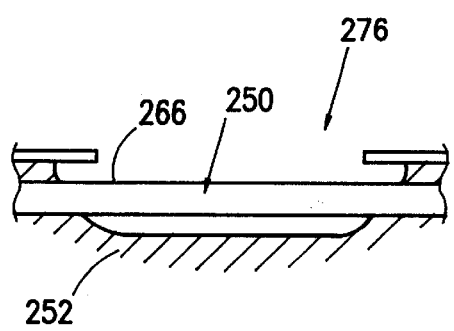
FIG. 36 is a diagrammatic view of a tunnel structure fully released along a part of its length.

As illustrated diagrammatically in the side view of FIG. 36, at least a portion of the tunnel 250 can be completely released from the substrate 254 by a silicon etch in a selected region such as that illustrated at 276 in FIG. 34, with the remainder of the tunnel being secured in the silicon substrate for stability. The transparent oxide wall 266 is exposed by the silicon etch, as described above, with the oxide providing the mechanical support and structure for the tunnel.

The tunnel illustrated in FIGS. 34 through 36 may have particular application in electrophoresis or in other biochemical processes. For example, the tunnel may be used in a process for separating compounds such as DNA, RNA, or other molecules by charge-to-mass ratio or molecular weight. Basically, such a process is carried out by filling the long capillary tube 250 with a solution or a gel. The capillary may be from 25 to 75 cm long, and 10–180 micrometers in diameter. The compound to be measured is placed in one end of the capillary, for example at the inlet port 260 and a voltage potential is placed across the length of the solution in the capillary i.e., between the inlet and outlet ports 260 and 264. The resulting electric field causes the compound to move through the tube, with some components moving more quickly than others to produce separation. A laser or other light source may be directed through the tube; for example, at a transparent exposed portion such as that illustrated in FIG. 35 or in a transparent released segment such as that illustrated at 276 in FIG. 36, at a wavelength at which a compound in the capillary fluoresces so that when the compound reaches the transparent segment of the capillary, florescence due to the compound will be detected. The time needed for the compound to transit the tube can then be recorded and compared against a calibration compound whose charge-to-mass ratio is well known.

A further application of the tunneling process and structure described above is illustrated in FIGS. 37–39, to which reference in now made. As is known, ink jets for use in printers deliver ink from a supply through a small spray orifice, in the range of 10–100 micrometers in diameter. Typically, a resistor located in an ink chamber heats the liquid ink and causes it to expand. If the liquid is heated quickly enough, the solvent in the ink vaporizes and forms a gas bubble which, being less dense than the liquid, causes a volume expansion which will force ink out of the heating chamber in both directions. One direction goes back to the ink reservoir, while the other direction leads out the spray orifice and the resulting liquid spray may be directed, for example, toward a sheet of paper for printing.

Figure 37:
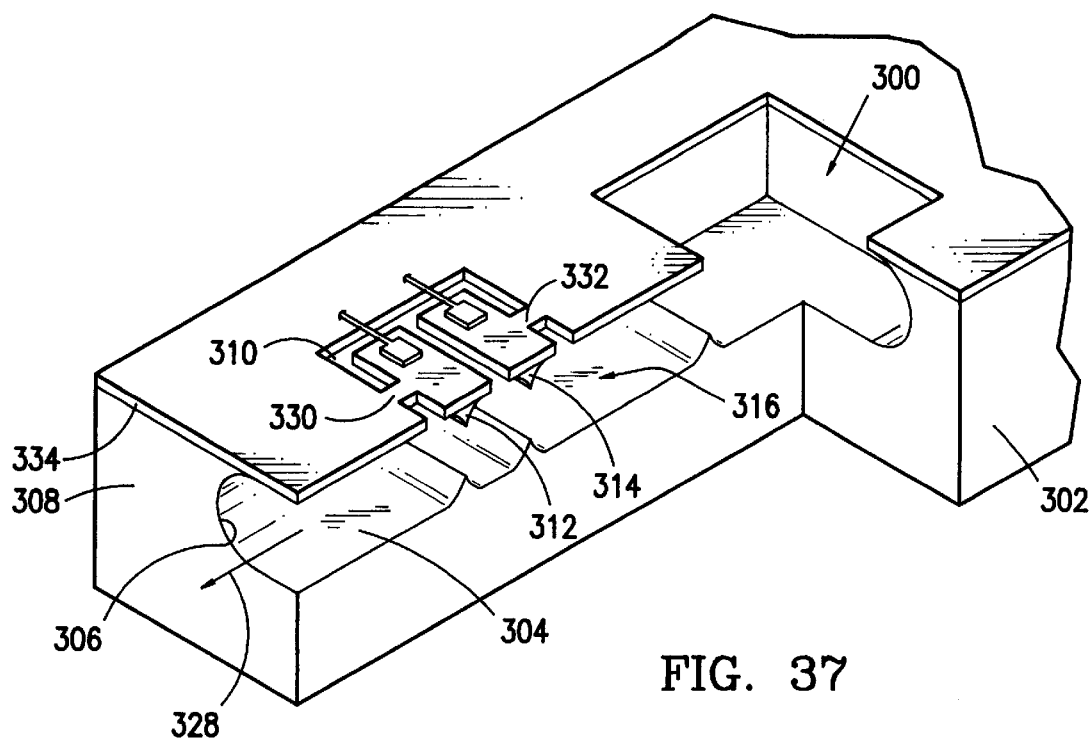
FIG. 37 is a diagrammatic, partially cut away perspective view of a subsurface microstructure fabricated in accordance with the present invention and adapted for use as an ink jet for printers.

In the embodiment of FIG. 37, an ink reservoir 300, similar to inlet port 260 in FIG. 34, is provided in a substrate 302, such as a single crystal silicon wafer, utilizing the RIE etching processes described above. A subsurface tunnel (or cavity) generally indicated at 304 leads from the reservoir to an outlet orifice 306 at an end wall 308 of the wafer. This orifice 306 may be an ink jet spray orifice. A via 310 defines the location of the subsurface tunnel 304 and, as illustrated in the figures, surrounds and defines two parallel overhanging bars 312 and 314. The bars overhang an enlarged cavity 316 formed, for example, by the merger of three parallel subsurface tunnels perpendicular to tunnel 304, and are connected at their upper surfaces by way of electrical contacts 320, 321, 322, 323 and by way of conductors 324 and 326 to circuitry (not shown) such as heater control circuits on the wafer 302. (See FIG. 38). The contacts 320 and 321 are fabricated in the manner described with respect to FIG. 33 at opposite ends of the overhanging bar 312 to allow a current to flow through this bar. The bar then acts as a resistive heater for fluid in chamber 316. Similarly, the contacts 322 and 323 are connected at opposite ends of bar 314 to allow current to pass through that bar so that it, too, acts as a resistive heater. By controlling the current flow through these bars, fluid in the chamber 316 may be heated and ejected out of the orifice 306 to provide an ink jet 328 or similar fluid pump.

Although the overhanging resistor bars 312 and 314 are illustrated as being transverse to the direction of flow of liquid through the tunnel 304, it will be understood that they can be parallel to the direction of flow, since the exact shape of the tunnel, its size, the locations and orientations of the overhanging bars, the number of bars, and the like, are selectable in accordance with the desired flow characteristics, and are fabricated in the manner described above.

It will be noted in FIG. 37 that the overhanging bars 312 and 314 are supported by bridges 330 and 332. These bridges are formed from the oxide masking layer 334, with the silicon being etched away from the areas under the bridges during the fabrication process so as to electrically isolate the overhanging bars 312 and 314 from the adjacent substrate. It will be understood that following formation of the illustrated tunnels and cavities, the via channels 310 will be sealed and thereafter the electrical contacts will be formed, in the manner illustrated in FIGS. 30–33, and as illustrated by sealing layer 336 in FIG. 39.

Figure 38:
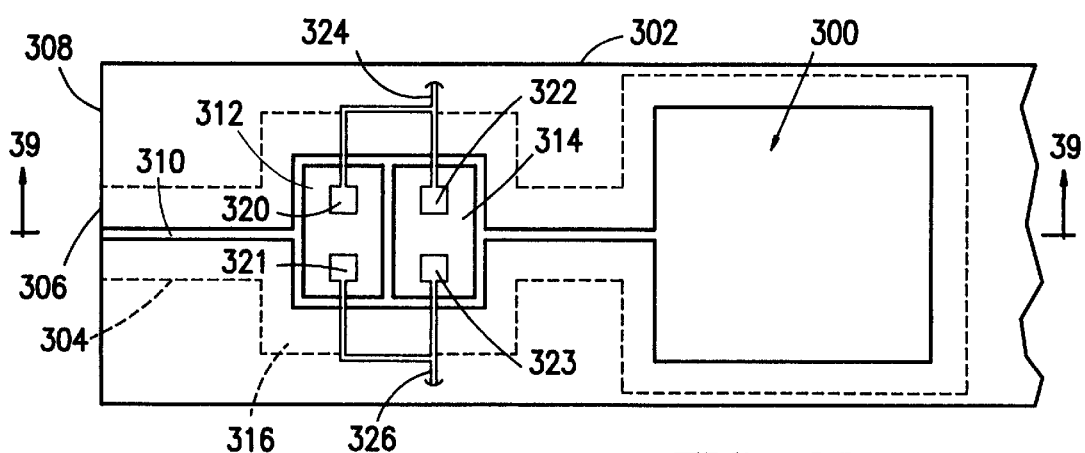
FIG. 38 is a top plan view of the device of FIG. 37.
Figure 39:
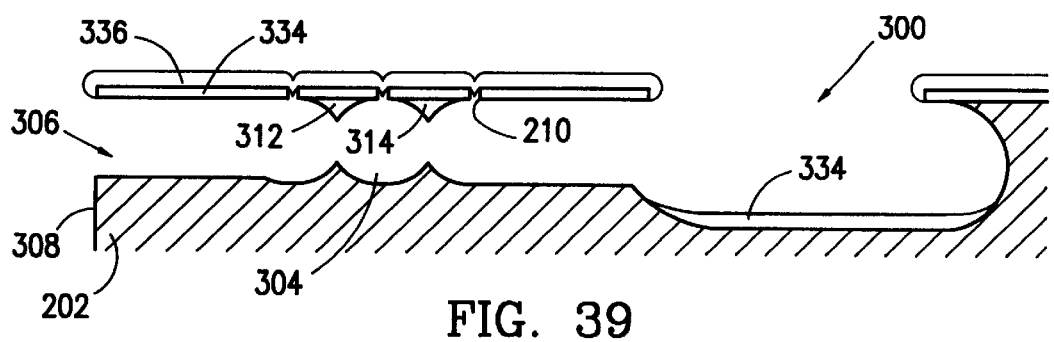
FIG. 39 is a cross-section taken along line 39—39 of FIG. 38.

FIG. 40 is a top plan view of a second version of the ink jet printer nozzle described with respect to FIGS. 37–39. In this figure, two identical ink tunnels 340 and 340' are illustrated, but it will be understood that multiple tunnels can be provided. Tunnel 340 is similar to cavity 304, but is fabricated through parallel via channels 342, 344 which extend along the length of tunnel 340 but are segmented, as at 346, to provide supporting bridges for an axially extending overhanging bar 347 as discussed above. The overhanging bar is segmented by transverse via channels such as those illustrated at 348 and 350 to produce axial segments such as those illustrated in dotted lines at 351, 352, and 353 which extend in parallel to the longitudinal axis of the tunnel 340. As described with respect to FIG. 37, the tunnel 340 extends from a reservoir 354 to the front wall 355 of the substrate 356 in which the tunnel is formed, where the tunnel exit is a spray orifice. It will be noted that opposite ends of the overhanging bar segment 352 are connected by way of metal connector lines 357 and 358, which may extend to suitable control circuitry on the substrate (not shown) as discussed above. As illustrated in the Figure, multiple parallel tunnels such as tunnel 340' may be provided, each having a separate control to produce the desired controllable ink jet output streams.

FIG. 41 illustrates an embodiment of the invention wherein two tunnels 370 and 372 are fabricated in a substrate 374 so as to intersect at a junction 376. A similar arrangement is illustrated in top plan view in FIG. 42, wherein intersecting tunnels 380 and 382 are fabricated in a substrate 384. In this case, tunnel 382 may be made up of a pair of short adjacent tunnels with a membrane 386 of the type illustrated in FIG. 20 between them, while tunnel 380 may be a single tunnel or a cavity made up of plural merged tunnels in the manner illustrated, for example, in FIG. 14. Such a subsurface structure may utilize the membrane 386 to filter fluids flowing through tunnel 380 in the direction of arrows 388, for example, or may be used in a Rutherford-type experiment where particles or molecules are accelerated along tunnel 380 in the direction of arrow 388 to strike the membrane 386. In the latter case, some of the particles will pass through the membrane and others will be scattered, with the number of particles going through being related to the thickness of the membrane, for example.

The tunnel structure of the invention may be used as a magnetic field source in the manner illustrated in FIG. 43, wherein a single tunnel 400 formed through a via channel 402 is released by a silicon etch. The tunnel wall 404 of silicon provides a continuous electrical path from one edge 406 of the via to an opposite edge 408. These edges may be connected by way of metal contacts 410 and 412 such as the contacts illustrated in FIGS. 31 and 32, and metal conductors 414 and 416 to suitable external circuitry 418. The circuitry 418 provides a potential across the contacts, thereby causing a current flow in the tunnel wall in the direction, for example, of arrow 420. The tunnel wall then acts as a solenoid winding to produce a magnetic field within the tunnel which may used to process material such as a fluid, electrons, or other particles within the tunnel, for example, or may be used to regulate its flow. If desired, a metal layer may be deposited on the wall, with the metal providing the current path.

Figure 44:
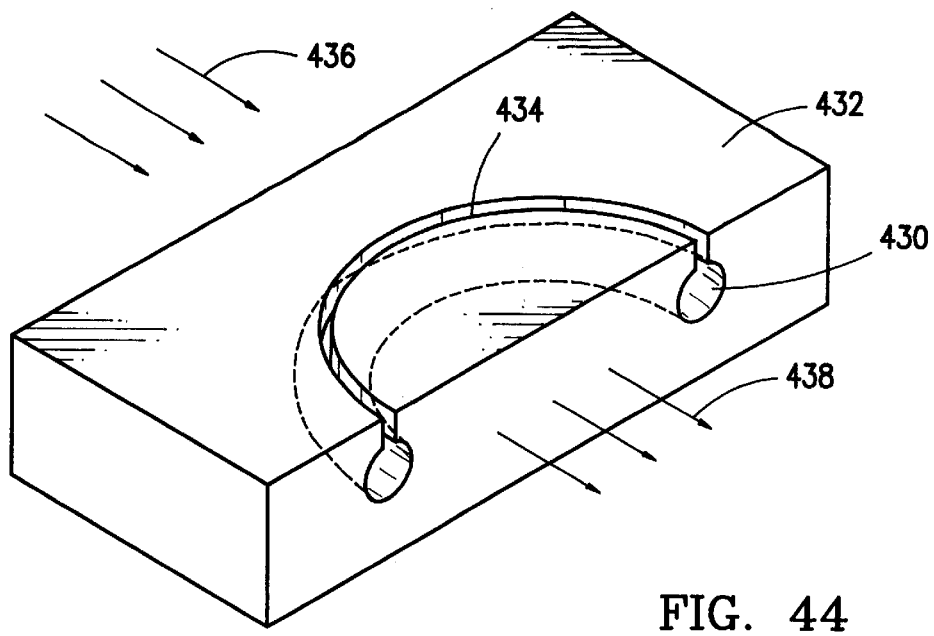
FIG. 44 is a diagrammatic perspective view of a lens fabricated in accordance with the invention.

A still further embodiment of the invention is illustrated in FIG. 44 wherein a curved tunnel 430 is formed in a substrate 432. The path of the tunnel is defined by via channel 434, as discussed above, and in this case the entire substrate 432 is optically transparent to impinging light 436 of selected wavelength. The tunnel 430 is filled with a material having a selected refractive index and the curvature of the tunnel is selected so as to enable the tunnel and the substrate to act as a lens. The curvature and the index of refraction of the material in the tunnel produce focused output light 438 and direct it to a target; for example, to a waveguide or into another tunnel within the substrate (not shown) with the fluid in the tunnel 430 being available to modulate the light transmissivity of the lens.

Figure 45:
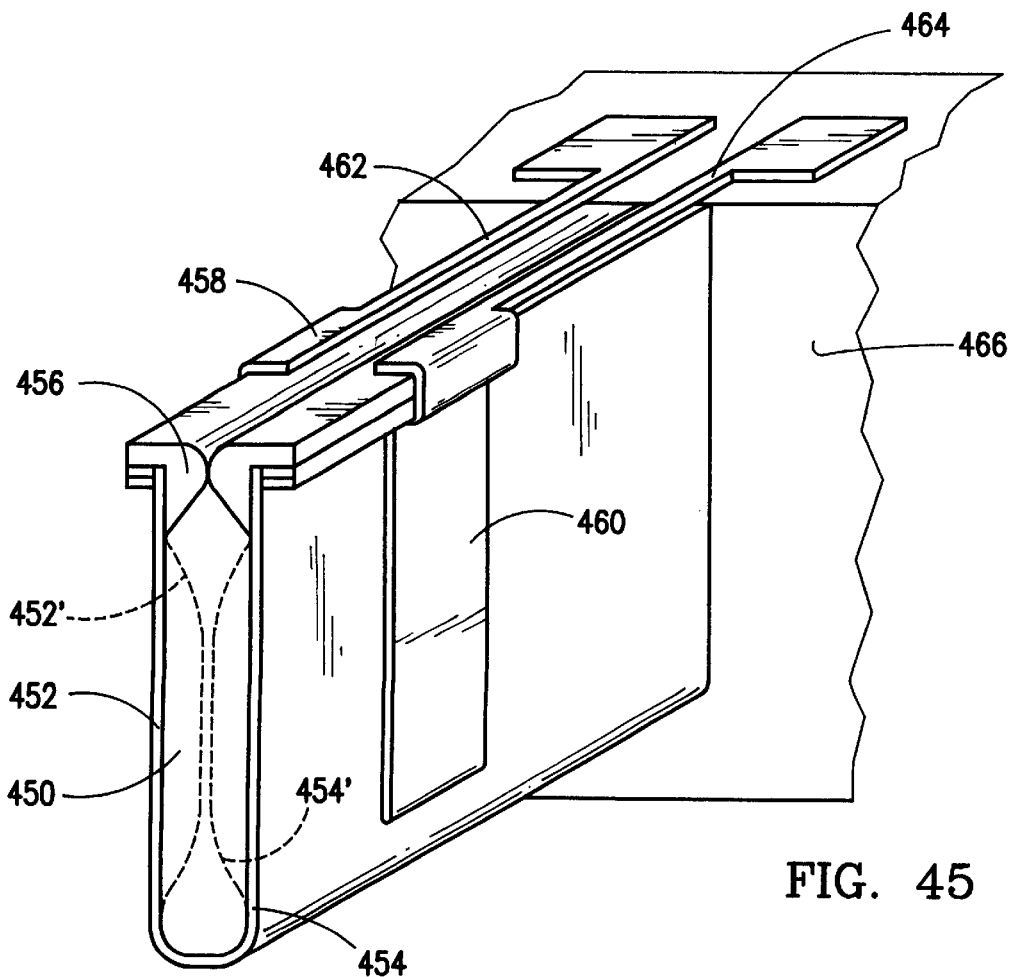
FIG. 45 is a diagrammatic perspective view of a released tunnel structure incorporating flexible side walls.
Figure 46:
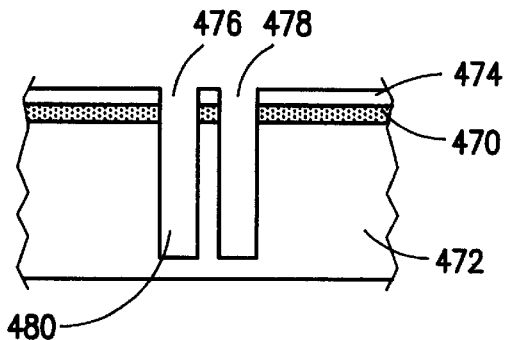
FIGS. 46–49 diagrammatically illustrate a process for fabricating parallel cavities separated by a flexible membrane.
Figure 47:
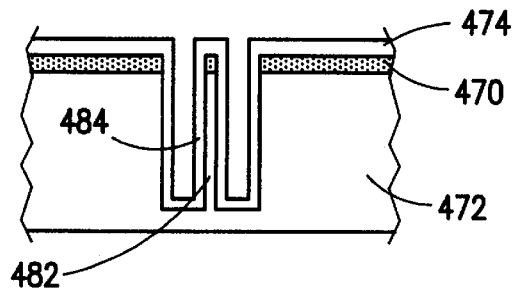

FIG. 45 illustrates another embodiment of the invention wherein a tall, narrow tunnel 450 is provided, the tunnel having thin, flexible side walls 452 and 454. The tunnel is closed by sealing material 456 in the manner discussed above, and surface electrodes 458 and 460 are deposited on the side walls of the tunnels by suitable masking techniques as discussed above, with the side wall electrodes being connected through corresponding conductors 462 and 464 to corresponding control circuits on the substrate 466 from which the tunnel 450 extends.

When a potential difference is applied between electrodes 458 and 460 these electrodes, which act as capacitor plates, are attracted to bend the side walls 452 and 454 of the tunnel inwardly, as indicated by dotted lines 452' and 454'. This collapsing action of the side wall of the tunnel can be used to produce a pumping force on fluids in the tunnel 450 so that a series of such flexible wall segments spaced along a tunnel 450 can be sequentially actuated to pump fluids through the tunnel. Etching of the elongated shape illustrated in FIG. 45 can also be accomplished by etching vertically into the substrate just prior to etching the channel with an isotropic etch.

FIGS. 46–49 illustrate a method for fabricating a thin membrane between adjacent tunnels. In this process, a nitride layer 470 is deposited on a silicon substrate 472 and an oxide mask layer 474 is deposited on top of the nitride layer. The mask layer 474 is patterned and a vertical etch produces trenches 476 and 478 on opposite sides of an island 480. The trenches are narrow enough that they can be sealed, in the manner described above, while the island 480 is positioned to define the location of the membrane for the tunnels to be formed.

Figure 48:
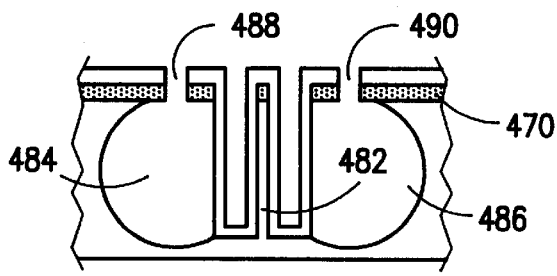
Figure 49:
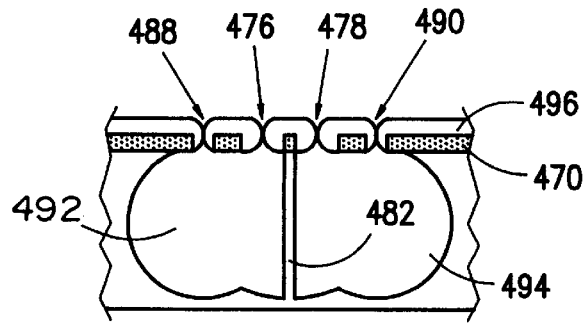

The device is oxidized, as by thermal oxidation, to thin the silicon in island 480, leaving a silicon membrane 482 surrounded by an oxide layer 484. The oxidation is continued until the membrane 482 is of the desired thickness, for thermal oxidation of vertical side walls is very uniform and controllable. Thereafter, as illustrated in FIG. 48, tunnels 484 and 486 are fabricated through via channels 488 and 490, in the manner previously described, with the tunnels being located on opposite sides of the membrane 482. As illustrated in FIG. 49, an isotropic oxide etch then removes the oxide formed by the thermal oxidation, but does not remove the nitride layer 470, thus forming the enlarged tunnels, or cavities 492 and 494 on opposite sides of the membrane 482. The via channels 488 and 490 and the trenches 476 and 478 are then sealed by deposition of sealing layer 496 to produce enclosed tunnels. Although the membrane 482 is shown as being approximately the same depth as the tunnels 492 and 494, it will be understood that the tunnels can be made deeper, or shallower than the depth of the membrane.

By forcing a fluid through one of the tunnels, such as tunnel 492, the fluid may cause the membrane 482 to deflect to the right, for example, as viewed in FIG. 49, to produce a change in the fluid pressure in tunnel 494, which change can be detected and measured. Thus, the membrane can serve as a sensitive pressure sensor. Alternatively, positioning of membranes along the length of a tunnel can produce a pumping action in the manner described above with respect to FIG. 45. If desired, overhanging beams can be provided in the tunnels 492 and/or 494 so that the fluid in one tunnel can be heated, for example, to produce expansion and a resultant pumping action or can produce a deflection in the membrane which can be sensed.

Figure 50:
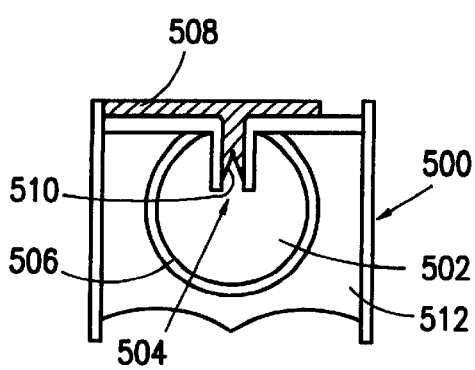
FIG. 50 is a diagrammatic illustration of a subsurface structure including a metal electrode in contact with the interior of a tunnel.

FIG. 50 illustrates a modified form of the tunnel of the present invention wherein an electrode provides direct contact with fluids within the tunnel. Thus, for example, a cantilevered arm 500 may include a tunnel 502 fabricated through a via channel 504 in the manner described with respect to FIGS. 1–5. The tunnel may be oxidized to provide a protective layer 506 and the via channel 504 is then closed by means of a metal layer 508. The metal layer extends into the via channel 504 to provide a surface 510 which is in contact with fluids within tunnel 502. Such a fluid may be, for example, and electrolyte which provides a current path through the tunnel. This current path is insulated by oxide layer 506 from the silicon material 512 which surrounds the tunnel. A similar direct contact with tunnel fluids can also be provided for a subsurface channel, if desired.

A preferred way to contact the fluid would be to seal the channel with a dielectric, then open small vias along the channel to expose the interior of the channel. The dielectric material is then covered with a metal layer which fills the vias, and the metal layer is patterned to separate the locations where the fluid is contacted, so that electrically isolated contacts are made with the fluid.

Segments of the oxide layer 506 within the channel 502 of FIG. 50 may be exposed along the length of the channel in the manner shown in FIG. 36, with the oxide providing the mechanical support. In addition, isolated silicon segments of the channel can be formed along its length to produce spaced silicon segments electrically isolated from adjacent segments by oxide segments.

The foregoing processes for fabricating subsurface tunnels within a substrate is extremely simple, allowing such tunnels with optional overhanging isolating bars to be fabricated and sealed with a single mask. In addition, implantation, formation of contacts, and metallization can be accomplished with only two additional masks. The process can be easily scaled to permit very small tunnels, on the order of 2 µm or less, or large tunnels 30 µm or greater in diameter. The tunnels can be placed very close together, with arbitrary separations. The physically, and thus thermally and electrically, isolated bar overhanging the tunnel provides numerous advantages and great flexibility in the treatment or processing of fluids or particles within the tunnels, as well as the control or sensing of fluid characteristics and parameters. The ability to provide a thin wall, or membrane between adjacent tunnels or as the outer wall of a tunnel, has numerous applications. The ability to provide released, or suspended beams and tubes which are thermally and electrically isolated from each other and from the surrounding substrate and which can be vibrated for measuring the mass of the fluid within the tube or which can be transparent to enable optical monitoring and treatment of the fluid are extremely important capabilities. The wall of the released tube can be silicon or it can be silicon dioxide and can have a thickness of about 0.5 micrometers or less.

Although the invention has been described in terms of preferred forms, it will be understood that variations and modifications can be made without departing from the true spirit and scope thereof, as set forth in the accompanying claims.

What is claimed is:

1. A process for fabrication of subsurface structures comprising:
   producing, on a surface of a substrate, a mask having a pattern defining the location and configuration of a subsurface cavity to be formed;
   vertically etching said substrate through said mask pattern to produce in said substrate at least one via channel corresponding to said pattern;
   isotropically etching said substrate through said via channel to produce within said substrate and below the surface thereof said subsurface cavity; and
   etching said substrate around said cavity and said via channel to produce a structure which is at least partially released from said substrate and which contains said cavity.

2. The process of claim 1, wherein said vertical etching of said substrate produces a via channel having substantially vertical sidewalls leading to said cavity.

3. The process of claim 2, further including depositing a protective layer on said via channel sidewalls prior to isotropically etching said substrate.

4. The process of claim 1, further including controlling said isotropic substrate etch to regulate the dimensions of said subsurface cavity.

5. The process of claim 1, wherein the step of producing said mask pattern includes defining the location and configuration of at least two closely-spaced cavities, and wherein etching said substrate through said pattern mask produces corresponding closely-spaced via channels in said surface.

6. The process of claim 5, wherein isotropically etching said substrate includes etching subsurface channels corresponding to each of said via cavities.

7. The process of claim 6, further including depositing a protective layer in said via channels prior to said isotropic etch.

8. The process of claim 6, further including controlling the duration of said isotropic substrate etching of said subsurface cavities to produce a membrane wall between adjacent subsurface cavities.

9. The process of claim 6, further including controlling the duration of said isotropic substrate etch to produce cavities having varying diameters along their lengths.

10. The process of claim 6, further including controlling the duration of said isotropic substrate etch to cause said subsurface cavities to merge to form a single subsurface merged cavity.

11. The process of claim 10, further including defining in said mask pattern the number and spacing of said cavities to thereby define the dimensions of said subsurface merged cavity upon said merger.

12. The process of claim 11, wherein said cavities are elongated, and further including varying dimensions of said merged cavity along the length thereof by varying the number and spacing of said elongated cavities.

13. The process of claim 10, further including forming from said substrate between said vias at least one overhanging bar above said single subsurface merged cavity, said bar being separated from said substrate.

14. The process of claim 13, further including forming an electrical contact on at least one said overhanging bar.

15. The process of claim 13, further including forming dielectric support bridges for said at least one overhanging bar, said bridges extending between said overhanging bar and said substrate.

16. The process of claim 15, further including:
    forming at least one electrical contact on said at least one overhanging bar; and
    fabricating an electrical connector between said contact and a second contact.

17. The process of claim 6, further including forming electrical contacts in communication with each of said subsurface cavities.

18. The process of claim 6, further including:
    controlling the duration of said isotropic substrate etch to produce a membrane wall between adjacent cavities; and
    forming an electrical contact on said substrate in contact with said membrane.

19. The process of claim 1, further including forming a dielectric layer on an inner surface of said cavity prior to sealing said via channel.

20. The process of claim 1, further including shaping said cavity by an anisotropic etch through said via channel prior to sealing.

21. The process of claim 1, wherein etching around said cavity includes substantially completely releasing said structure to produce a cantilevered beam containing said cavity.

22. The process of claim 1, wherein etching said substrate around said cavity produces a structure having an upper thin wall portion enclosing said cavity and a lower portion connected to said substrate.

23. The process of claim 1, wherein etching said substrate around said cavity produces a released beam containing said cavity.

24. The process of claim 22, wherein etching said substrate around said cavity exposes a cavity wall surrounding said cavity.

25. The process of claim 1, further including sealing said via channel to close said cavity.

26. The process of claim 25, wherein isotropically etching said substrate includes etching intersecting subsurface cavities, one said cavity having a dividing membrane.

27. A process for the fabrication of subsurface structures, comprising:

forming in the surface of a substrate an elongated via channel having a width sufficiently large to permit isotropic etching of the substrate through the via channel;

isotropically etching the substrate below the via channel to produce an elongated cavity within the substrate; and at least partially releasing an elongated beam within said substrate and containing said elongated cavity.

28. The process of claim 27, wherein at least partially releasing an elongated beam includes etching said substrate around said cavity to produce an exposed wall for at least a part of said cavity.

29. The process of claim 27, wherein at least partially releasing an elongated beam includes etching said substrate to produce a cantilevered beam containing said elongated cavity.

30. The process of claim 27, wherein at least partially releasing an elongated beam includes:

thermally oxidizing said cavity to provide an oxide wall surrounding the cavity; and etching said substrate to expose at least a portion of said oxide wall.

31. The process of claim 30, wherein etching said substrate includes completely releasing a region of said beam to expose said oxide wall around said cavity.

* * * * *